US012563919B2

(12) United States Patent
Koo et al.

(10) Patent No.: US 12,563,919 B2
(45) Date of Patent: Feb. 24, 2026

(54) DISPLAY DEVICE

(71) Applicant: Samsung Display Co., LTD., Yongin-si (KR)

(72) Inventors: Bon Yong Koo, Hwaseong-si (KR); Su Jin Lee, Hwaseong-si (KR); Dan Won Lim, Seoul (KR); Jae Yong Jang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 678 days.

(21) Appl. No.: 17/832,787

(22) Filed: Jun. 6, 2022

(65) Prior Publication Data

US 2023/0117174 A1 Apr. 20, 2023

(30) Foreign Application Priority Data

Oct. 14, 2021 (KR) ........................ 10-2021-0136397

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02); *H10K 59/1216* (2023.02)

(58) Field of Classification Search
None
See application file for complete search history.

(56) References Cited

U.S. PATENT DOCUMENTS

| | | | |
|---|---|---|---|
| 10,978,538 B2 | 4/2021 | Wang et al. | |
| 11,177,340 B2 | 11/2021 | Kim et al. | |
| 11,659,738 B2 | 5/2023 | Wang et al. | |
| 12,048,208 B2 | 7/2024 | Wang et al. | |
| 2019/0229160 A1* | 7/2019 | Lee | H10K 59/131 |
| 2020/0083309 A1* | 3/2020 | Wang | H10D 30/6723 |
| 2021/0043712 A1* | 2/2021 | Kim | G06F 3/0443 |
| 2022/0059640 A1* | 2/2022 | Park | H10K 59/131 |
| 2024/0341133 A1 | 10/2024 | Wang et al. | |

FOREIGN PATENT DOCUMENTS

| | | |
|---|---|---|
| KR | 1020100121893 | 11/2010 |
| KR | 1020190090417 | 8/2019 |
| KR | 20200029103 A | 3/2020 |
| KR | 20210018687 A | 2/2021 |

* cited by examiner

*Primary Examiner* — Sue A Purvis
*Assistant Examiner* — Carnell Hunter, III
(74) *Attorney, Agent, or Firm* — CANTOR COLBURN LLP

(57) ABSTRACT

A display device includes: a substrate including a display area including a plurality of pixels for displaying an image and a non-display area disposed around the display area; data lines disposed in the display area and which receive data signals; and first fan-out lines and second fan-out lines in the non-display area and connected to the data lines. Each of the first fan-out lines includes a first sub-fan-out line and a second sub-fan-out line which overlap each other in a plan view, each of the second fan-out lines includes a third sub-fan-out line and a fourth sub-fan-out line which overlap each other in the plan view, and the first sub-fan-out line, the second sub-fan-out line, the third sub-fan-out line, and the fourth sub-fan-out line are disposed in different conductive layers from each other.

19 Claims, 21 Drawing Sheets

120: Ch1
130: G1, CE3
140: CE1
150: CE2, G9-1, BML2
160: Ch9
170: G9-2
180: S1, D1,S9, D9, BE1

120: Ch2, Ch6
130: G2, G6
180: S2, D2, S6, D6, DL

NDA: A1, BA, A2
FL: FL1, FL2
BL: BL1, BL2
PL: PL1, PL2

FL1: SFL1, SFL2
FL2: SFL3, SFL4

FL1: SFL1, SFL2

FL2: SFL3, SFL4

PL1: SPL1, SPL2
PL2: SPL3, SPL4

PL1: SPL1, SPL2
PL2: SPL3, SPL4

FL1: SFL1, SFL2
FL2: SFL3, SFL4

FL1: SFL1, SFL2

CT2 DL CT4 BL2

CN2

VIA1

IL2

GIL4

IL1

GIL3

GIL2

GIL1

SUB

III SFL3(140) SFL4(170) III'

FL2: SFL3, SFL4

FL1: SFL1, SFL2
FL2: SFL3, SFL4

FL1: SFL1, SFL2

FL2: SFL3, SFL4

NDA: A1, BA, A2
FL: FL1, FL2
BL: BL1, BL2
PL: PL1, PL2

FL1: SFL1, SFL2, SFL5
FL2: SFL3, SFL4

DISPLAY DEVICE

This application claims priority to Korean Patent Application No. 10-2021-0136397, filed on Oct. 14, 2021, and all the benefits accruing therefrom under 35 U.S.C. § 119, the content of which in its entirety is herein incorporated by reference.

BACKGROUND

1. Technical Field

The present disclosure relates to a display device.

2. Description of the Related Art

As the information society develops, the demand for a display device for displaying images has increased and diversified. For example, the display device has been applied to various electronic devices such as smartphones, digital cameras, laptop computers, navigation devices, smart watches, and smart televisions. The display device may be a flat panel display device such as a liquid crystal display device, a field emission display device, or an organic light emitting display device.

The display device may include a plurality of pixels, each of which includes a light emitting element, a driving transistor adjusting an amount of a driving current supplied from a power source to the light emitting element according to a voltage of a gate electrode thereof, a plurality of switch elements switched according to scan signals of scan lines, and a plurality of capacitors.

The display device includes a display area in which an image is displayed and a non-display area disposed around the display area. A plurality of lines applying signals to the display area are disposed in the non-display area. Resistance of the plurality of lines may decrease when a line width of the plurality of lines is decreased or a thickness of the plurality of lines is increased. When the resistance of the lines disposed in the non-display area decreases, resistor-capacitor (RC) delay of the signals decreases, and thus, a high-resolution display device may be implemented.

SUMMARY

Aspects of the present disclosure provide a display device in which resistance of each signal line disposed in a non-display area is decreased by increasing a thickness of each signal line.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to the embodiments of the disclosure, a display device includes: a substrate including a display area including a plurality of pixels for displaying an image and a non-display area disposed around the display area; data lines disposed in the display area and which receive data signals; and first fan-out lines and second fan-out lines in the non-display area and connected to the data lines. Each of the first fan-out lines includes a first sub-fan-out line and a second sub-fan-out line which overlap each other in a plan view, each of the second fan-out lines includes a third sub-fan-out line and a fourth sub-fan-out line which overlap each other in the plan view, and the first sub-fan-out line, the second sub-fan-out line, the third sub-fan-out line, and the fourth sub-fan-out line are disposed in different conductive layers from each other.

The first sub-fan-out line and the second sub-fan-out line may be electrically connected to each other through a first contact hole, and the third sub-fan-out line and the fourth sub-fan-out line are electrically connected to each other through a second contact hole.

The first fan-out lines and the second fan-out lines may be alternately arranged in one direction.

Each of the plurality of pixels may include a first transistor including a first semiconductor layer disposed on the substrate and a first gate electrode disposed on the first semiconductor layer, a capacitor including a first capacitor electrode disposed on the first gate electrode and a second capacitor electrode disposed on the first capacitor electrode, and a second transistor including a second semiconductor layer disposed on the second capacitor electrode and a second gate electrode disposed on the second semiconductor layer, where the second semiconductor layer may include a material different from that of the first semiconductor layer.

The first semiconductor layer may include polysilicon, and the second semiconductor layer includes an oxide semiconductor.

The first sub-fan-out line may be disposed in the same layer as a layer in which the first gate electrode is disposed, the second sub-fan-out line is disposed in the same layer as a layer in which the first capacitor electrode is disposed, the third sub-fan-out line is disposed in the same layer as a layer in which the second capacitor electrode is disposed, and the fourth sub-fan-out line is disposed in the same layer as a layer in which the second gate electrode is disposed.

The first sub-fan-out line may be disposed in the same layer as a layer in which the first gate electrode is disposed, the second sub-fan-out line is disposed in the same layer as a layer in which the second capacitor electrode is disposed, and the third sub-fan-out line is disposed in the same layer as a layer in which the first capacitor electrode is disposed, and the fourth sub-fan-out line is disposed in the same layer as a layer in which the second gate electrode is disposed.

The first sub-fan-out line may be disposed in the same layer as a layer in which the first gate electrode is disposed, the second sub-fan-out line is disposed in the same layer as a layer in which the second gate electrode is disposed, and the third sub-fan-out line is disposed in the same layer as a layer in which the first capacitor electrode is disposed, and the fourth sub-fan-out line is disposed in the same layer as a layer in which the second capacitor electrode is disposed.

According to another embodiment of the disclosure, a display device includes: a substrate, a first insulating film disposed on the substrate, a first gate electrode and a first sub-fan-out line disposed on the first insulating film, a second insulating film disposed on the first gate electrode and the first sub-fan-out line, a first capacitor electrode and a second sub-fan-out line disposed on the second insulating film, a third insulating film disposed on the first capacitor electrode and the second sub-fan-out line, a second capacitor electrode and a third sub-fan-out line disposed on the third insulating film, a fourth insulating film disposed on the second capacitor electrode and the third sub-fan-out line, and a second gate electrode and a fourth sub-fan-out line disposed on the fourth insulating film, where two of the first sub-fan-out line, the second sub-fan-out line, the third sub-fan-out line, and the fourth sub-fan-out line overlap each other, and the other two of the first sub-fan-out line, the second sub-fan-out line, the third sub-fan-out line, and the fourth sub-fan-out line overlap each other in a plan view.

the second sub-fan-out line may be connected to the first sub-fan-out line through a first contact hole penetrating through the second insulating film, and the fourth sub-fan-out line is connected to the third sub-fan-out line through a second contact hole penetrating through the fourth insulating film.

the third sub-fan-out line may be connected to the first sub-fan-out line through a third contact hole penetrating through the second insulating film and the third insulating film, and the fourth sub-fan-out line is connected to the second sub-fan-out line through a fourth contact hole penetrating through the third insulating film and the fourth insulating film.

the third sub-fan-out line may be connected to the second sub-fan-out line through a fifth contact hole penetrating through the third insulating film, and the fourth sub-fan-out line is connected to the first sub-fan-out line through a sixth contact hole penetrating through the second insulating film, the third insulating film, and the fourth insulating film.

A display device may further include a fifth sub-fan-out line disposed between the substrate and the first insulating film, where the fifth sub-fan-out line overlaps two of the first sub-fan-out line, the second sub-fan-out line, the third sub-fan-out line, and the fourth sub-fan-out line in the plan view.

the first sub-fan-out line may be connected to the fifth sub-fan-out line through a seventh contact hole penetrating through the first insulating film.

The first gate electrode, the first capacitor electrode, and the second capacitor electrode may overlap each other in the plan view.

According to another embodiment of the disclosure, a display device includes: a display area including a plurality of pixels, a line area disposed on one side of the display area, a pad area including a plurality of pads, a bending area disposed between the line area and the pad area, a first fan-out line and a second fan-out line disposed in the line area, a first bending line disposed in the bending area and connected to the first fan-out line and a second bending line disposed in the bending area and connected to the second fan-out line, and a first pad line disposed in the pad area and connected to the first bending line and a second pad line disposed in the pad area and connected to the second bending line, where the first pad line includes a first sub-pad line and a second sub-pad line which overlap each other in a plan view, the second pad line includes a third sub-pad line and a fourth sub-pad line which overlap each other in the plan view, the first sub-pad line, the second sub-pad line, the third sub-pad line, and the fourth sub-pad line are disposed in different conductive layers from each other.

The first fan-out line may include a first sub-fan-out line and a second sub-fan-out line which overlap each other in the plan view, the second fan-out line includes a third sub-fan-out line and a fourth sub-fan-out line which overlap each other in the plan view, and the first sub-fan-out line, the second sub-fan-out line, the third sub-fan-out line, and the fourth sub-fan-out line are disposed in different conductive layers from each other.

The first sub-fan-out line and the first sub-pad line may be disposed in the same layer, and the second sub-fan-out line and the second sub-pad line are disposed in the same layer.

The second sub-fan-out line and the third sub-pad line may be disposed in the same layer, and the third sub-fan-out line and the second sub-pad line are disposed in the same layer.

The first fan-out line, the first bending line, and the first pad line may have the same signal applied thereto, and the second fan-out line, the second bending line, and the second pad line have the same signal applied thereto.

With the display device according to embodiments, a plurality of signal lines disposed in a non-display area are disposed to overlap each other in different conductive layers, such that resistance of the signal lines may be decreased. Accordingly, a display device having decreased RC delay may be implemented.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Hereinafter, specific embodiments will be described with reference to the accompanying drawings.

Figure 1:
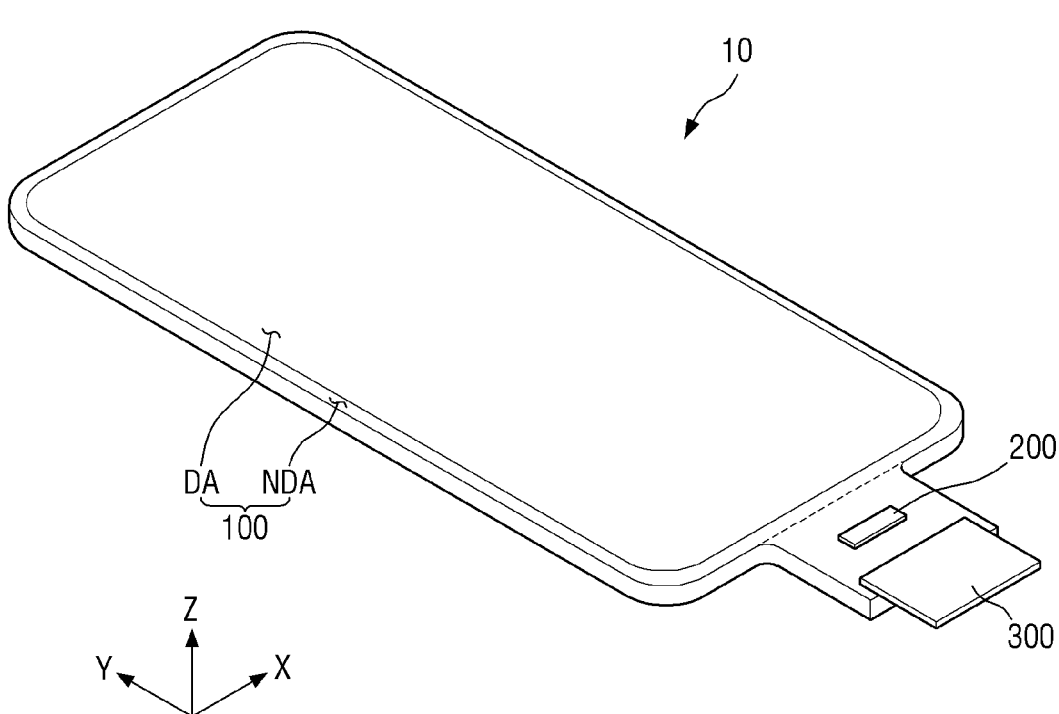
FIG. 1 is a perspective view illustrating a display device according to an embodiment.

FIG. 1 is a perspective view illustrating a display device according to an embodiment.

Referring to FIG. 1, a display device 10 is a device that displays a moving image or a still image, and may be used as a display screen of each of various products such as televisions, laptop computers, monitors, billboards, and Internet of Things ("IOT") devices as well as portable electronic devices such as mobile phones, smartphones, tablet personal computers ("PCs"), smart watches, watch phones, mobile communication terminals, electronic notebooks, electronic books, portable multimedia players ("PMPs"), navigation devices, and ultra mobile PCs ("UMPCs").

The display device 10 may be a light emitting display device such as an organic light emitting display device using an organic light emitting diode, a quantum dot light emitting display device including a quantum dot light emitting layer, an inorganic light emitting display device including an inorganic semiconductor, and a micro light emitting display device using a micro or nano light emitting diode (micro "LED" or nano LED). Hereinafter, it will be mainly described that the display device 10 is the organic light emitting display device, but the present disclosure is not limited thereto.

The display device 10 includes a display panel 100, a display driving circuit 200, and a circuit board 300.

The display panel 100 may be in a rectangular shape, in a plan view (i.e., view in Z-axis direction: a thickness direction of a substrate SUB), having short sides in a first direction (X-axis direction) and long sides in a second direction (Y-axis direction) crossing the first direction (X-axis direction). A corner where the short side in the first direction (X-axis direction) and the long side in the second direction (Y-axis direction) meet may be rounded with a predetermined curvature or right-angled. The shape of the display panel 100 in a plan view is not limited to the rectangular shape, and may be a polygonal shape, a circular shape, or an elliptical shape in another embodiment. The display panel 100 may be flat, but is not limited thereto. For example, the display panel 100 may include curved surface parts formed at left and right ends thereof and having a constant curvature or a variable curvature. In addition, the display panel 100 may be flexibly formed to be bent, folded, or rolled.

The display panel 100 may include a display area DA for displaying an image and a non-display area NDA, which is a peripheral area of the display area DA. The display area DA may include a plurality of pixels for displaying an image.

The display driving circuit 200 may generate signals and voltages for driving the display panel 100. The display driving circuit 200 may be formed as an integrated circuit ("IC") and be attached onto the display panel 100 in a chip on glass ("COG") manner, a chip on plastic ("COP") manner, or an ultrasonic bonding manner, but is not limited thereto. For example, the display driving circuit 200 may be attached onto the circuit board 300 in a chip on film ("COF") manner.

The circuit board 300 may be attached to one end of the display panel 100. Therefore, the circuit board 300 may be electrically connected to the display panel 100 and the display driving circuit 200. The display panel 100 and the display driving circuit 200 may receive digital video data, timing signals, and driving voltages through the circuit board 300. The circuit board 300 may be a flexible film such as a flexible printed circuit board, a printed circuit board, or a chip on film.

Figure 2:
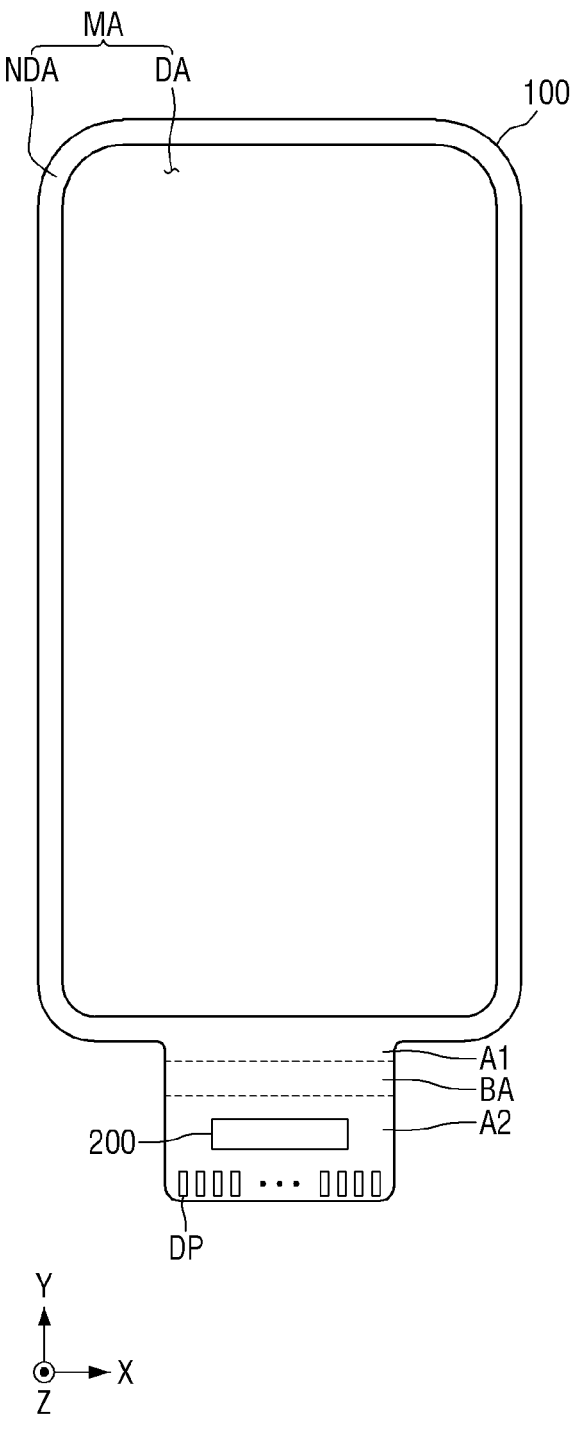
FIG. 2 is a plan view illustrating the display device according to an embodiment.
Figure 3:
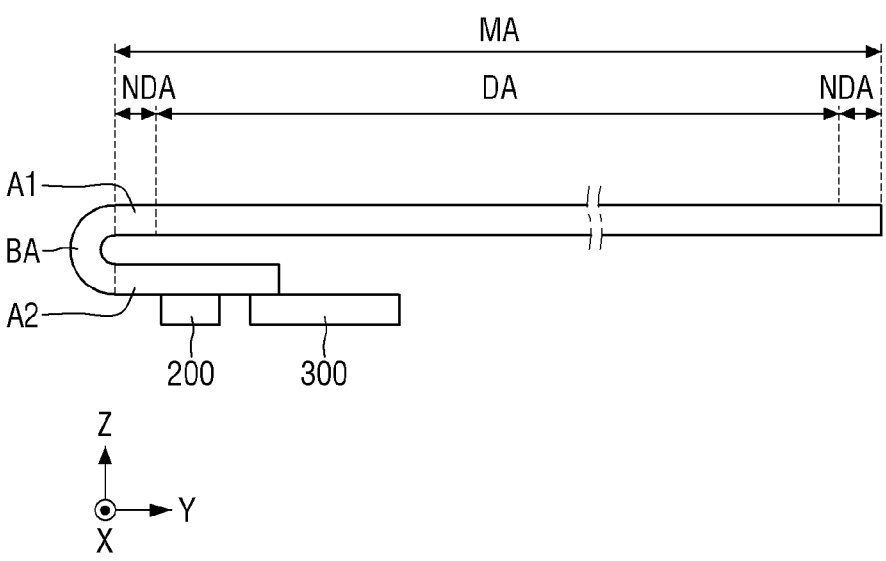
FIG. 3 is a side view illustrating the display device according to an embodiment.

FIG. 2 is a plan view illustrating the display device according to an embodiment. FIG. 3 is a side view illustrating the display device according to an embodiment.

Referring to FIGS. 2 and 3, the display panel 100 may include a main area MA, a bending area BA, and a pad area A2.

The main area MA may include the display area DA displaying an image and a first part of the non-display area NDA, which is the peripheral area of the display area DA.

The display area DA may occupy most of the main area MA. The display area DA may be disposed at the center of the main area MA. A second part of the non-display area NDA includes the bending area BA, and the pad area A2.

The first part of the non-display area NDA may be disposed adjacent to the display area DA. The first part of the non-display area NDA may be an area outside the display area DA. The first part of the non-display area NDA may be disposed to surround the display area DA. The first part of the non-display area NDA may be an edge area of the display panel 100. The first part of the non-display area NDA may include a line area A1.

The line area A1 is a portion of the first part of the non-display area NDA, and may be disposed on one side of the display area DA in the second direction (Y-axis direction). The line area A1 may be disposed between the display area DA and the bending area BA. The line area A1 may include a plurality of fan-out lines FL (see FIG. 4) connecting a plurality of signal lines existing in the display area DA and the display driving circuit 200 of the pad area A2 to each other.

The bending area BA and the pad area A2 may protrude from one side of the main area MA in the second direction (Y-axis direction). A length of each of the bending area BA and the pad area A2 in the second direction (Y-axis direction) may be smaller than a length of the main area MA in the second direction (Y-axis direction). A length of each of the bending area BA and the pad area A2 in the first direction (X-axis direction) may be smaller than or be substantially the same as a length of the main area MA in the first direction (X-axis direction).

The pad area A2 is an area in which a plurality of pads DP and the display driving circuit 200 are disposed. The display driving circuit 200 may be attached to the pads DP of the pad area A2 using a low-resistance and high-reliability material such as an anisotropic conductive film or a self assembly anisotropic conductive paste ("SAP"). The circuit board 300 may be attached to the plurality of pads DP of the pad area A2 using a low-resistance and high-reliability material such as an anisotropic conductive film or an SAP. One side of the pad area A2 may be in contact with the bending area BA. When the bending area BA is bent, the pad area A2 may be disposed on a rear surface of the display panel 100. In this case, the pad area A2 may overlap the main area MA in a third direction (Z-axis direction) (i.e., the plan view).

The bending area BA is an area that is bent. When the bending area BA is bent, the pad area A2 may be disposed below the line area A1 and below the main area MA. The bending area BA may be disposed between the line area A1 and the pad area A2. One side of the bending area BA may be in contact with the line area A1, and the other side of the bending area BA may be in contact with the pad area A2.

Figure 4:
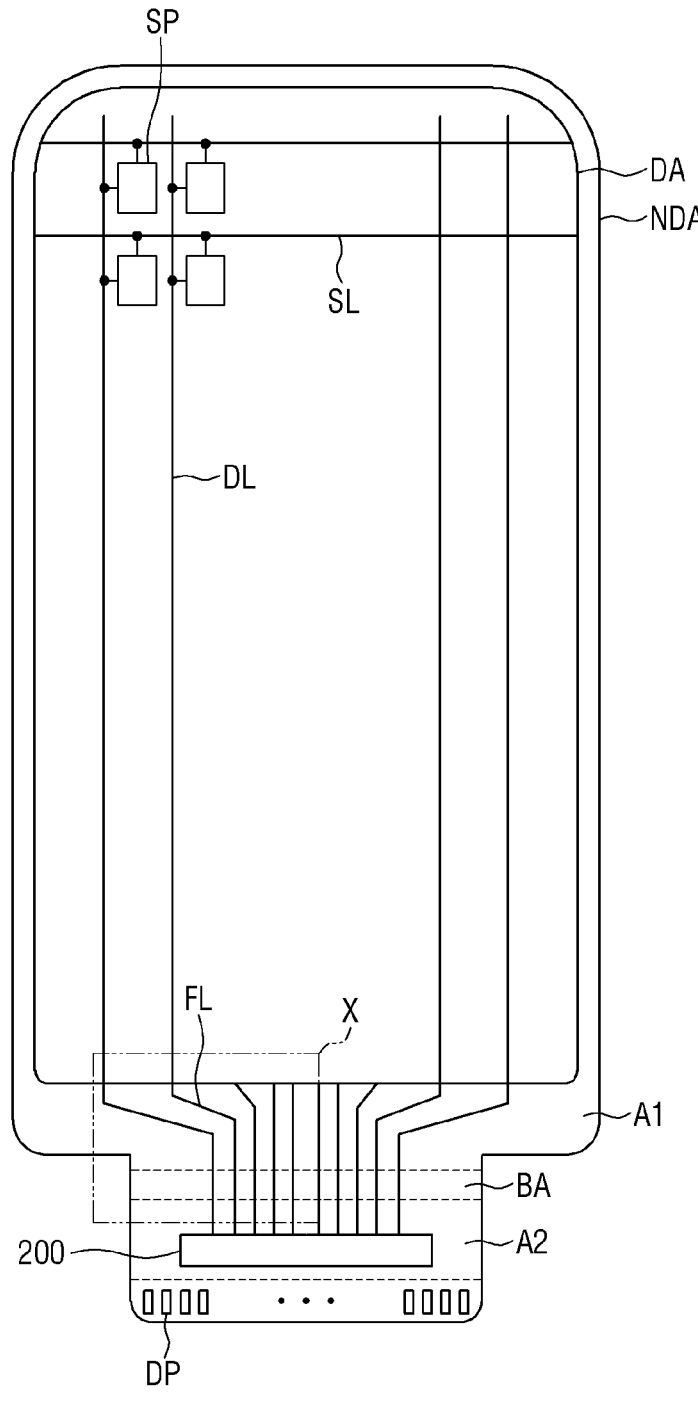
FIG. 4 is a plan view illustrating sub-pixels and signal lines of the display device according to an embodiment.

FIG. 4 is a plan view illustrating sub-pixels and signal lines of the display device according to an embodiment.

Referring to FIG. 4, the display area DA of the display panel 100 may include sub-pixels SP, scan lines SL, and data lines DL. The scan lines SL may extend in the first direction (X-axis direction) and may be disposed in the second direction (Y-axis direction).

The data lines DL may extend in the second direction (Y-axis direction) and may be disposed in the first direction (X-axis direction).

Each of the sub-pixels SP may be connected to the scan line SL and the data line DL. Each of the sub-pixels SP may include a driving transistor, a plurality of switch elements, a light emitting element, and a capacitor.

The plurality of switch elements may be controlled by the scan line SL, and accordingly, a data voltage of the data line DL may be applied to a gate electrode of the driving transistor.

The driving transistor may allow the light emitting element to emit light by supplying a driving current to the light emitting element according to the data voltage applied to the gate electrode thereof. The light emitting element may emit the light according to the driving current of the driving transistor. The light emitting element may be an organic light emitting diode including a first electrode, an organic light emitting layer, and a second electrode. Alternatively, the light emitting element may be an inorganic light emitting diode including a first electrode, an inorganic semiconductor, and a second electrode. Alternatively, the light emitting element may be a micro light emitting diode in a micro unit or a nano unit. The capacitor may serve to maintain the data voltage applied to the gate electrode of the driving transistor for a predetermined period. The sub-pixel SP will be described later with reference to FIG. 5.

The non-display area NDA of the display panel 100 may include fan-out lines FL connecting the data lines DL of the display area DA and the display driving circuit 200 to each other. In addition, although not illustrated, it is obvious that the non-display area NDA may further include a scan driver for applying signals to the scan lines and fan-out lines connecting the scan lines SL to each other.

The fan-out lines FL may be disposed in the line area A1, which is a portion of the non-display area NDA. The fan-out lines FL may extend to the bending area BA and the pad area A2 to be connected to the plurality of pads DP in the pad area A2, respectively. As another example, the fan-out lines FL may be connected to bending lines BL (see FIG. 8) disposed in the bending area BA and pad lines PL (see FIG. 8) disposed in the pad area A2, respectively, to be electrically connected to the plurality of pads DP, respectively. This will be described later with reference to FIG. 8.

Figure 5:
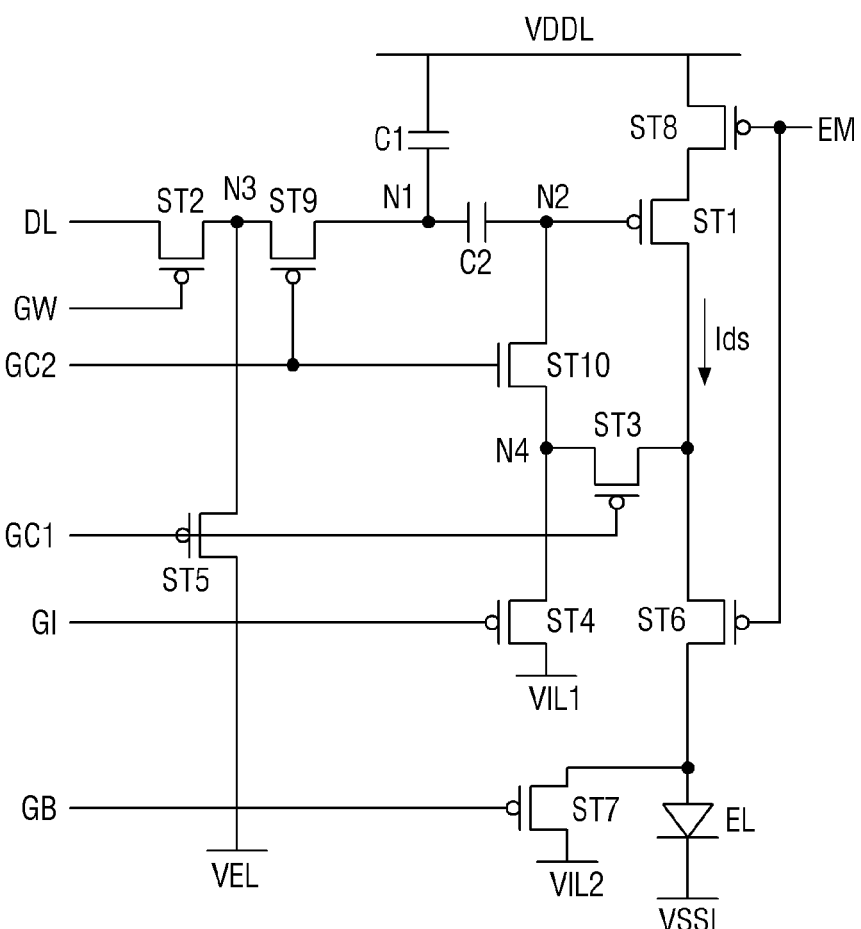
FIG. 5 is a circuit diagram illustrating a sub-pixel according to an embodiment in detail.

FIG. 5 is a circuit diagram illustrating a sub-pixel according to an embodiment in detail.

Referring to FIG. 5, the sub-pixel SP may be connected to a first scan initialization line GI, a scan-write line GW, a first scan control line GC1, a second scan control line GC2, a second scan initialization line GB, an emission control line EM, and a data line DL. In addition, the sub-pixel SP may be connected to a first driving voltage line VDDL to which a first driving voltage is supplied, a first initialization voltage line VIL1 to which a first initialization voltage is supplied, a second initialization voltage line VIL2 to which a second initialization voltage is supplied, a reference voltage line VEL to which a reference voltage is supplied, and a second driving voltage line VSSL to which a second driving voltage is supplied.

The sub-pixel SP includes a first transistor ST1 corresponding to a driving transistor, a light emitting element EL, a plurality of switch elements, a first capacitor C1, and a second capacitor C2. The plurality of switch elements includes second to tenth transistors ST2, ST3, ST4, ST5, ST6, ST7, ST8, ST9, and ST10.

The first transistor ST1 may correspond to the driving transistor and include a gate electrode, a first electrode, and a second electrode. The first transistor ST1 controls a drain-source current Ids (hereinafter, referred to as a "driving current") flowing between the first electrode and the second electrode according to a data voltage applied to the gate electrode.

The gate electrode of the first transistor ST1 may be connected to the second node N2, the first electrode of the first transistor ST1 may be connected to a second electrode of the eighth transistor ST8, and the second electrode of the first transistor ST1 may be connected to a first electrode of the third transistor ST3 and a first electrode of the sixth transistor ST6.

The light emitting element EL emits light according to the driving current Ids. An amount of light emitted from the light emitting element EL may be proportional to the driving current Ids.

The light emitting element EL may be an organic light emitting diode including an anode electrode, a cathode electrode, and an organic light emitting layer disposed between the anode electrode and the cathode electrode. Alternatively, the light emitting element EL may be an inorganic light emitting element including an anode electrode, a cathode electrode, and an inorganic semiconductor disposed between the anode electrode and the cathode electrode. Alternatively, the light emitting element EL may be a quantum dot light emitting element including an anode electrode, a cathode electrode, and a quantum dot light emitting layer disposed between the anode electrode and the cathode electrode. Alternatively, the light emitting element EL may be a micro light emitting diode.

The anode electrode of the light emitting element EL may be connected to a second electrode of the sixth transistor ST6 and a second electrode of the seventh transistor ST7, and the cathode electrode of the light emitting element EL may be connected to the second driving voltage line VSSL.

The second transistor ST2 is turned on by a scan-write signal of the scan-write line GW to connect a third node N3 and the data line DL to each other. A gate electrode of the second transistor ST2 may be connected to the scan-write line GW, a first electrode of the second transistor ST2 may be connected to the data line DL, and a second electrode of the second transistor ST2 may be connected to the third node N3.

The third transistor ST3 is turned on by a first scan control signal applied to the first scan control line GC1 to connect a fourth node N4 corresponding to a first electrode of the tenth transistor ST10 and the second electrode of first transistor ST1 to each other. When the tenth transistor ST10 is turned on together with the third transistor ST3, the gate electrode and the second electrode of the first transistor ST1 are connected to each other, and thus, the first transistor ST1 is driven as a diode. A gate electrode of the third transistor ST3 may be connected to the first scan control line GC1, the first electrode of the third transistor ST3 may be connected to the second electrode of the first transistor ST1, and the second electrode of the third transistor ST3 may be connected to the first electrode of the tenth transistor ST10.

The fourth transistor ST4 is turned on by a first scan initialization signal of the first scan initialization line GI to connect the fourth node N4 corresponding to the first electrode of the tenth transistor ST10 and the first initialization voltage line VIL1 to each other. The fourth node N4 may be discharged to the first initialization voltage of the first initialization voltage line VIL1. A gate electrode of the fourth transistor ST4 may be connected to the first scan initialization line GI, a first electrode of the fourth transistor ST4 may be connected to the first initialization voltage line VIL1, and a second electrode of the fourth transistor ST4 may be connected to the fourth node N4.

The fifth transistor ST5 is turned on by the first scan control signal applied to the first scan control line GC1 to connect the third node N3 and the reference voltage line VEL to each other. The reference voltage of the reference voltage line VEL may be supplied to the third node N3. A gate electrode of the fifth transistor ST5 may be connected to the first scan control line GC1, a first electrode of the fifth transistor ST5 may be connected to the reference voltage line VEL, and a second electrode of the fifth transistor ST5 may be connected to the third node N3.

The sixth transistor ST6 is turned on by an emission control signal of the emission control line EM to connect the second electrode of the first transistor ST1 and the anode electrode of the light emitting element EL to each other. A gate electrode of the sixth transistor ST6 may be connected to the emission control line EM, the first electrode of the sixth transistor ST6 may be connected to the second electrode of the first transistor ST1, and the second electrode of the sixth transistor ST6 may be connected to the anode electrode of the light emitting element EL. When the sixth transistor ST6 is turned on, the driving current Ids may be supplied to the light emitting element EL.

The seventh transistor ST7 is turned on by a second scan initialization signal of the second scan initialization line GB to connect the anode electrode of the light emitting element EL and the second initialization voltage line VIL2 to each other. The light emitting element EL may be discharged to the second initialization voltage of the second initialization voltage line VIL2. A gate electrode of the seventh transistor T7 may be connected to the second scan initialization line GB, a first electrode of the seventh transistor T7 may be connected to the second initialization voltage line VIL2, and the second electrode of the seventh transistor T7 may be connected to the anode electrode of the light emitting element EL.

The eighth transistor ST8 is turned on by the emission control signal of the emission control line EM to connect the first transistor ST1 and the first driving voltage line VDDL to each other. A gate electrode of the eighth transistor ST8 may be connected to the emission control line EM, a first electrode of the eighth transistor ST8 may be connected to the first driving voltage line VDDL, and the second electrode of the eighth transistor ST8 may be connected to the first electrode of the first transistor ST1.

The ninth transistor ST9 may be turned on by a second scan control signal of the second scan control line GC2 to connect the third node N3 and a first node N1 to each other. The reference voltage of the third node N3 may be supplied to the first node N1. A gate electrode of the ninth transistor ST9 may be connected to the second scan control line GC2, a first electrode of the ninth transistor ST9 may be connected to the third node N3 corresponding to the second electrode of the second transistor ST2, and a second electrode of the ninth transistor ST9 may be connected to the first node N1.

The tenth transistor ST10 may be turned on by the second scan control signal of the second scan control line GC2 to connect the second node N2 and the fourth node N4 to each other. When the tenth transistor ST10 is turned on, the gate electrode and the second electrode of the first transistor ST1 are connected to each other, and thus, the first transistor ST1 is driven as a diode. A gate electrode of the tenth transistor ST10 may be connected to the second scan control line GC2, the first electrode of the tenth transistor ST10 may be connected to the fourth node N4, and a second electrode of the tenth transistor ST10 may be connected to the second node N2.

The first capacitor C1 is formed between the first driving voltage line VDDL and the first node N1. One electrode of the first capacitor C1 may be connected to the first driving voltage line VDDL, and the other electrode of the first capacitor C1 may be connected to the first node N1. The first capacitor C1 may store a voltage difference between the first driving voltage line VDDL and the first node N1. Accordingly, a voltage difference between the first driving voltage line VDDL and the first node N1 may be maintained by the first capacitor C1.

The second capacitor C2 is formed between the first node N1 and the second node N2. One electrode of the second capacitor C2 may be connected to the second node N2, and the other electrode of the second capacitor C2 may be connected to the first node N1. The second capacitor C2 may store a voltage difference between the first node N1 and the second node N2. Accordingly, a voltage difference between the first node N1 and the second node N2 may be maintained by the second capacitor C2.

As described later with reference to FIGS. 6 and 7, the other electrode of the first capacitor C1 and the other electrode of the second capacitor C2 may share one capacitor electrode with each other. In the present specification, the one capacitor electrode is referred to as a first capacitor electrode CE1. The first capacitor electrode CE1 may be the other electrode of each of the first capacitor C1 and the second capacitor C2. In addition, one electrode of the first capacitor C1 may be referred to as a second capacitor electrode CE2, and one electrode of the second capacitor C2 may be referred to as a third capacitor electrode CE3. The third capacitor electrode CE3, the first capacitor electrode CE1, and the second capacitor electrode CE2 may be disposed in a first gate layer 130, a second gate layer 140, and a third gate layer 150, respectively, and may overlap each other in a thickness direction of the substrate SUB (i.e., the plan view).

The first node N1 may be a contact point between the second electrode of the ninth transistor ST9, the other electrode of the first capacitor C1, and the other electrode of the second capacitor C2. The second node N2 may be a contact point between the gate electrode of the first transistor ST1 and the second electrode of the tenth transistor ST10. The third node N3 may be a contact point between the second electrode of the second transistor ST2, the first electrode of the ninth transistor ST9, and the second electrode of the fifth transistor ST5. The fourth node N4 may be a contact point between the second electrode of the third transistor ST3, the second electrode of the fourth transistor ST4, and the first electrode of the tenth transistor ST10.

For example, the first electrodes of the first to eighth transistors ST1 to ST8 may be source electrodes and the second electrodes of the first to eighth transistors ST1 to ST8 may be drain electrodes, but the present disclosure is not limited thereto. In addition, the first electrodes of the ninth and tenth transistors ST9 and ST10 may be drain electrodes, and the second electrodes of the ninth and tenth transistors ST9 and ST10 may be source electrodes.

A semiconductor layer of each of the first to eighth transistors ST1 to ST8 may be formed of any one of a silicon semiconductor such as polysilicon and amorphous silicon, or an oxide semiconductor. For example, a semiconductor layer of each of the first to eighth transistors ST1 to ST8 formed as P-channel metal oxide semiconductor field effect transistors ("P-MOSFETs") may be formed of a silicon semiconductor, and a semiconductor layer of each of the ninth and tenth transistors ST9 and ST10 formed as N-channel metal oxide semiconductor field effect transistors ("N-MOSFETs") may be formed of an oxide semiconductor.

The first driving voltage of the first driving voltage line VDDL, the second driving voltage of the second driving voltage line VSSL, the first initialization voltage of the first initialization voltage line VIL1, the second initialization voltage of the second initialization voltage line VIL2, and the reference voltage of the reference voltage line VEL may be set in consideration of characteristics of the first transistor ST1, which is the driving transistor, characteristics of the light emitting element EL, and the like. For example, a voltage difference between the initialization voltage and the first driving voltage applied to the source electrode of the first transistor ST1 may be set to be smaller than a threshold voltage of the first transistor ST1.

Figure 6:
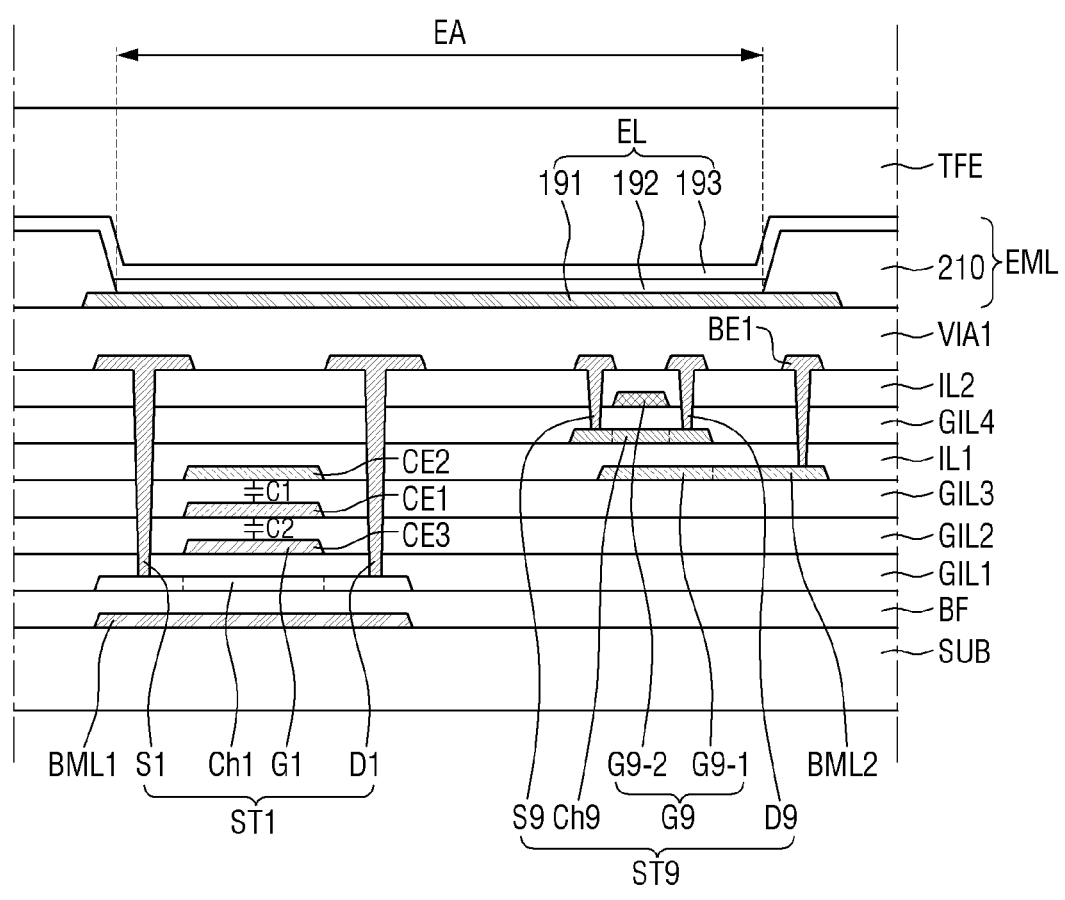
FIG. 6 is a cross-sectional view illustrating first and ninth transistors of the sub-pixel of FIG. 5.
Figure 7:
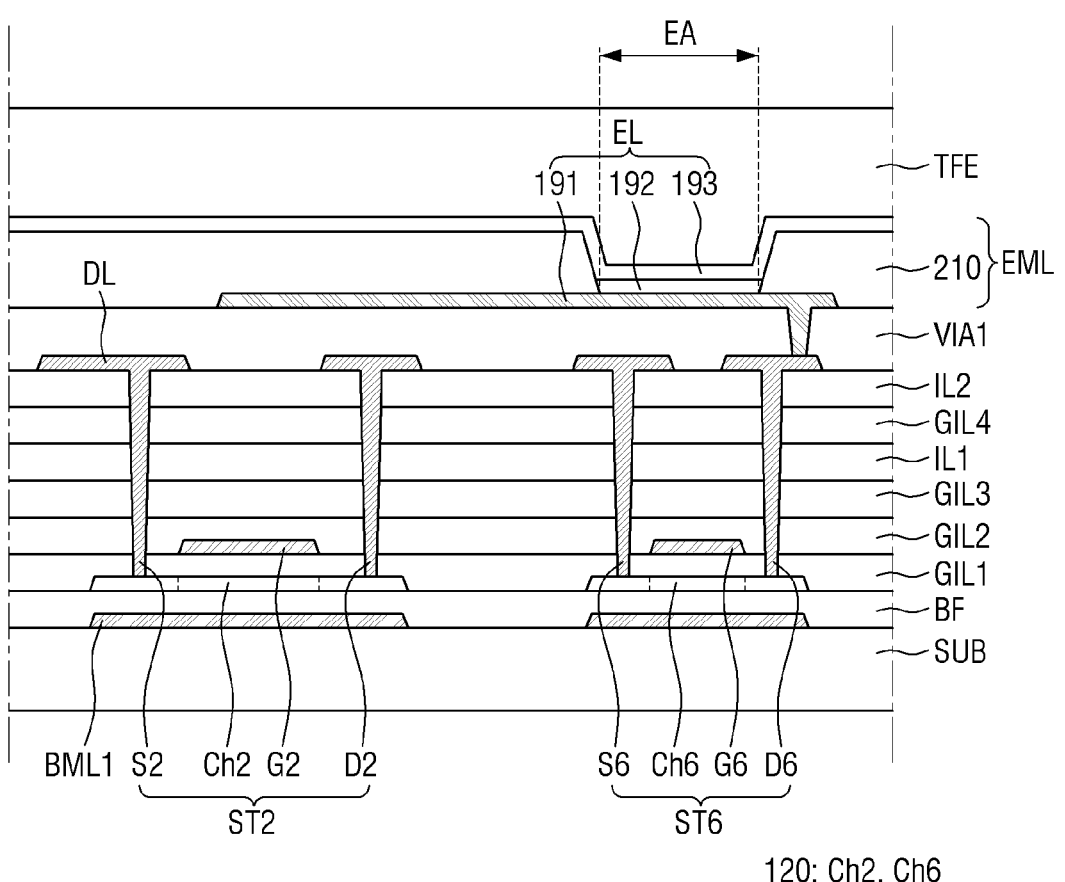
FIG. 7 is a cross-sectional view illustrating second and sixth transistors of the sub-pixel.

FIG. 6 is a cross-sectional view illustrating first and ninth transistors of the sub-pixel of FIG. 5, and FIG. 7 is a cross-sectional view illustrating second and sixth transistors of the sub-pixel. In FIGS. 6 and 7, the first transistor ST1 including a first semiconductor layer 120, the second transistor ST2 and the sixth transistor ST6, which are switch elements, and the ninth transistor ST9 including a second semiconductor layer 160 have been illustrated. The third to fifth transistors ST3 to ST5 (not illustrated in FIGS. 6 and 7)

may correspond to the second transistor ST2 or the sixth transistor ST6, and the tenth transistor ST10 (not illustrated in FIGS. 6 and 7) may correspond to the ninth transistor ST9.

Referring to FIGS. 6 and 7, a first light blocking layer BML1, a buffer layer BF, a first semiconductor layer 120, a first gate insulating film GIL1, a first gate layer 130, a second gate insulating film GIL2, a second gate layer 140, a third gate insulating film GIL3, a third gate layer 150, a first interlayer insulating film IL1, a second semiconductor layer 160, a fourth gate insulating film GIL4, a fourth gate layer 170, a second interlayer insulating film IL2, a source-drain layer 180, and a first planarization film VIA1 may be disposed on a substrate SUB. In addition, a light emitting element layer EML and an encapsulation layer TFE may be sequentially disposed.

The substrate SUB may be a base substrate, and may be made of an insulating material such as a polymer resin. For example, the substrate SUB may be a flexible substrate that may be bent, folded, or rolled.

The first light blocking layer BML1 may be disposed on the substrate SUB. The first light blocking layer BML1 may block external light incident on the first semiconductor layer 120 from the substrate SUB. The first light blocking layer BML1 may prevent a leakage current flowing to the first semiconductor layer 120 when light from the substrate SUB is incident on the first semiconductor layer 120. The first light blocking layer BML1 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof The buffer layer BF may be formed on the substrate SUB and the first light blocking layer BML1. The buffer layer BF may be formed on one surface of the substrate SUB in order to protect thin film transistors and an organic light emitting layer 192 of the light emitting element layer EML from moisture permeated through the substrate SUB vulnerable to moisture permeation.

The first semiconductor layer 120 may be disposed on the substrate SUB or the buffer layer BF. The first semiconductor layer 120 may be made of a silicon-based material. For example, the first semiconductor layer 120 may be made of low-temperature polycrystalline silicon ("LTPS"). The first semiconductor layer 120 may include channels Ch1 to Ch8 of the first to eighth transistors ST1 to ST8.

The first gate insulating film GIL1 may cover the buffer layer BF and the first semiconductor layer 120, and may insulate the first semiconductor layer 120 and the first gate layer 130 from each other. The first gate insulating film GIL1 may be formed as an inorganic film, for example, a silicon nitride layer, a silicon oxynitride layer, a silicon oxide layer, a titanium oxide layer, or an aluminum oxide layer.

The first gate layer 130 may be disposed on the first gate insulating film GIL1. The first gate layer 130 may include gate electrodes G1 to G8 of the first to eighth transistors ST1 to ST8 and a third capacitor electrode CE3. The third capacitor electrode CE3 is an electrode of the second capacitor C2, and may correspond to a portion of the gate electrode G1 of the first transistor ST1. The first gate layer 130 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof The second gate insulating film GIL2 may cover the first gate layer 130 and the first gate insulating film GIL1, and may insulate the first gate layer 130 and the second gate layer 140 from each other. The second gate insulating film GIL2 may include the same material as the first gate insulating film GIL1 described above.

The second gate layer 140 may be disposed on the second gate insulating film GIL2. The second gate layer 140 may include a first capacitor electrode CE1. The first capacitor electrode CE1 may overlap a second capacitor electrode CE2 to form the first capacitor C1, and may overlap the third capacitor electrode CE3 to form the second capacitor C2 in the plan view. The second gate layer 140 may include the same material as the first gate layer 130 described above.

The third gate insulating film GIL3 may cover the second gate layer 140 and the second gate insulating film GIL2, and may insulate the second gate layer 140 and the third gate layer 150 from each other. The third gate insulating film GIL3 may include the same material as the first gate insulating film GIL1 described above.

The third gate layer 150 may be disposed on the third gate insulating film GIL3. The third gate layer 150 may include the second capacitor electrode CE2 and a second light blocking layer BML2. The second capacitor electrode CE2 may overlap the first capacitor electrode CE1 to form the first capacitor C1 in the plan view. The second light blocking layer BML2 may block external light incident on the second semiconductor layer 160 from the substrate SUB, and may thus prevent a leakage current flowing to the second semiconductor layer 160.

In addition, the third gate layer 150 may include gate electrodes G9 and G10 of the ninth and tenth transistors ST9 and ST10. Referring to FIG. 7, when the ninth transistor ST9 has a double gate form, the gate electrode G9 of the ninth transistor ST9 may include a lower gate electrode G9-1 and an upper gate electrode G9-2, and the gate electrodes G9-1 and G9-2 may overlap a channel Ch9 of the ninth transistor ST9 included in the second semiconductor layer 160 in the plan view. In this case, a turn-on current of the ninth transistor ST9 may increase by 20 percentages (%) or more. The third gate layer 150 may be, for example, a conductive layer having a thickness of about 2500 angstroms (Å) and including molybdenum (Mo), but is not limited thereto, and may be formed as a single layer or multiple layers made of any one of aluminum (Al), chromium (Cr), gold (Au), titanium (Ti), nickel (Ni), neodymium (Nd), and copper (Cu), or alloys thereof.

The first interlayer insulating film IL1 may cover the third gate layer 150 and the third gate insulating film GIL3, and may insulate the third gate layer 150 and the second semiconductor layer 160 from each other. The first interlayer insulating film IL1 may be formed as an inorganic film, for example, a silicon nitride layer, a silicon oxynitride layer, a silicon oxide layer, a titanium oxide layer, or an aluminum oxide layer.

The second semiconductor layer 160 may be disposed on the first interlayer insulating film IL1. For example, the second semiconductor layer 160 may be made of an oxide-based material. The oxide may include one or more oxides selected from the group consisting of G-I-Z-O, zinc (Zn), indium (In), gallium (Ga), tin (Sn), cadmium (Cd), germanium (Ge), or hafnium (Hf), or combinations thereof. The oxide may include at least one of indium gallium zinc oxide ("IGZO"), zinc-tin oxide ("ZTO"), and indium-tin oxide ("IZO"). The second semiconductor layer 160 may include channels Ch9 and Ch10 of the ninth and tenth transistors ST9 and ST10.

The fourth gate insulating film GIL4 may cover the second semiconductor layer 160 and the first interlayer insulating film IL1, and may insulate the second semiconductor layer 160 and the fourth gate layer 170 from each other. The fourth gate insulating film GIL4 may include the same material as the first gate insulating film GIL1 described above.

The fourth gate layer 170 may be disposed on the fourth gate insulating film GIL4. In addition, the fourth gate layer 170 may include upper gate electrodes G9-2 and G10-2 of gate electrodes G9 and G10 of the ninth and tenth transistors ST9 and ST10. The fourth gate layer 170 may include the same material as the first gate layer 130 described above.

The second interlayer insulating film IL2 may cover the fourth gate layer 170 and the fourth gate insulating film GIL4. The second interlayer insulating film IL2 may insulate the fourth gate layer 170 and the source-drain layer 180 from each other.

The source-drain layer 180 may be disposed on the second interlayer insulating film IL2. The source-drain layer 180 may include first electrodes S1 to S8 and second electrodes D1 to D8 of the first to eighth transistors ST1 to ST8, and first electrodes D9 and D10 and second electrodes S9 and S10 of the ninth and tenth transistors ST9 and ST10. In addition, the source-drain layer 180 may include a data line DL and a first connection electrode BET. The first connection electrode BET may be an electrode connecting any one of the first initialization voltage line VIL1, the second initialization voltage line VIL2, the reference voltage line VEL, and the first driving voltage line VDDL to the second light blocking layer BML2. The source-drain layer 180 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The first planarization film VIA1 may cover the source-drain layer 180 and the second interlayer insulating film IL2. The first planarization film VIA1 may planarize a step due to the first semiconductor layer 120, the first gate layer 130, the second gate layer 140, the third gate layer 150, the second semiconductor layer 160, and the fourth gate layer 170, and the source-drain layer 180. The first planarization film VIA1 may be formed as an organic film made of an acryl resin, an epoxy resin, a phenolic resin, a polyamide resin, a polyimide resin, or the like.

The light emitting element layer EML is formed on the first planarization film VIA1. The light emitting element layer EML includes a light emitting element EL and a pixel defining film 210. The light emitting element EL may include a pixel electrode 191, the organic light emitting layer 192, and a common electrode 193.

The pixel electrode 191 may be formed on the first planarization film VIA1. The pixel electrode 191 may be connected to the first electrode S6 or the second electrode D6 of the sixth transistor ST6 through a contact hole penetrating through the first planarization film VIA1.

In a top emission structure in which light is emitted toward the common electrode 193 based on the organic light emitting layer 192, the pixel electrode 191 may be formed of a metal material having high reflectivity, such as a stacked structure (Ti/Al/Ti) of aluminum and titanium, a stacked structure ("ITO"/Al/ITO) of aluminum and indium tin oxide (ITO), an APC alloy, and a stacked structure (ITO/APC/ ITO) of an APC alloy and ITO. The APC alloy is an alloy of silver (Ag), palladium (Pd), and copper (Cu).

The pixel defining film 210 may be formed to partition the pixel electrode 191 on the first planarization film VIA1 in order to serve to define an emission area EA of the sub-pixel SP. The pixel defining film 210 may be formed to cover an edge of the pixel electrode 191. The pixel defining film 210 may be formed as an organic film made of an acryl resin, an epoxy resin, a phenolic resin, a polyamide resin, a polyimide resin, or the like.

The emission area EA of the sub-pixel SP refers to an area in which the pixel electrode 191, the organic light emitting layer 192, and the common electrode 193 are sequentially stacked and holes from the pixel electrode 191 and electrons from the common electrode 193 are combined with each other in the organic light emitting layer 192 to emit light.

The organic light emitting layer 192 is formed on the pixel electrode 191 and the pixel defining film 210. The organic light emitting layer 192 may include an organic material to emit light of a predetermined color. For example, the organic light emitting layer 192 may include a hole transporting layer, an organic material layer, and an electron transporting layer. The organic light emitting layer 192 of the sub-pixel SP may emit red, blue, or green light.

The common electrode 193 is formed on the organic light emitting layer 192. The common electrode 193 may be formed to cover the organic light emitting layer 192. The common electrode 193 may be a common layer commonly formed for each sub-pixel SP. A capping layer may be formed on the common electrode 193.

In the top emission structure, the common electrode 193 may be formed of a transparent conductive material ("TCO") such as ITO or IZO capable of transmitting light therethrough or a semi-transmissive conductive material such as magnesium (Mg), silver (Ag), or an alloy of magnesium (Mg) and silver (Ag). When the common electrode 193 is formed of the semi-transmissive conductive material, emission efficiency may be increased by a micro cavity.

The encapsulation layer TFE may be formed on the light emitting element layer EML. The encapsulation layer TFE may include at least one inorganic film in order to prevent oxygen or moisture from penetrating into the light emitting element layer EML. In addition, the encapsulation layer TFE may include at least one organic film in order to protect the light emitting element layer EML from foreign materials such as dust.

Alternatively, a second substrate may be disposed on the light emitting element layer EML instead of the encapsulation layer TFE, and a space between the light emitting element layer EML and the second substrate may be empty in a vacuum state or a filling film may be disposed in the space between the light emitting element layer EML and the second substrate. The filling film may be an epoxy filling film or a silicone filling film.

In the present embodiment, the first capacitor electrode CE1 of one sub-pixel SP may be disposed between the second capacitor electrode CE2 and the third capacitor electrode CE3 (or the gate electrode G1 of the first transistor ST1), and may overlap the second capacitor electrode CE2 and the third capacitor electrode CE3 in the third direction (Z-axis direction). In addition, one sub-pixel SP may include a switch element (e.g., 'ST9') including the second semiconductor layer 160 formed of an oxide semiconductor and an upper gate electrode (e.g., 'G9-2'). Accordingly, one sub-pixel SP may have a structure in which four conductive layers corresponding to the first gate layer 130, the second gate layer 140, the third gate layer 150, and the fourth gate layer 170 are sequentially stacked.

The four different conductive layers may include a plurality of fan-out lines FL (see FIG. 8) in the line area A1 of the non-display area NDA and may include a plurality of pad lines PL (see FIG. 8) in the pad area A2, respectively. Since first fan-out lines FL1 (see FIG. 8) may be disposed in any two of the four different conductive layers, and second fan-out lines FL2 (see FIG. 8) may be disposed in the others of the four different conductive layers, the plurality of fan-out lines FL may be formed as double lines. In addition, since first pad lines PL1 (see FIG. 8) may be disposed in any two of the four different conductive layers and second pad lines PL2 (see FIG. 8) may be disposed in the others of the four different conductive layers, the plurality of pad lines PL may be formed as double lines. When the plurality of fan-out lines FL and the plurality of pad lines PL are formed as the double lines, a thickness of the lines increases, and thus, resistance of the lines may decrease. When the resistance of the lines disposed in the non-display area NDA decreases, RC delay of signals may decrease.

In the present specification, each of the gate electrodes G1 to G8 of the first to eighth transistors ST1 to ST8 may be referred to as a first gate electrode, and each of the upper gate electrodes G9-2 and G10-2 of the ninth and tenth transistors ST9 and ST10 may be referred to as a second gate electrode.

Figure 8:
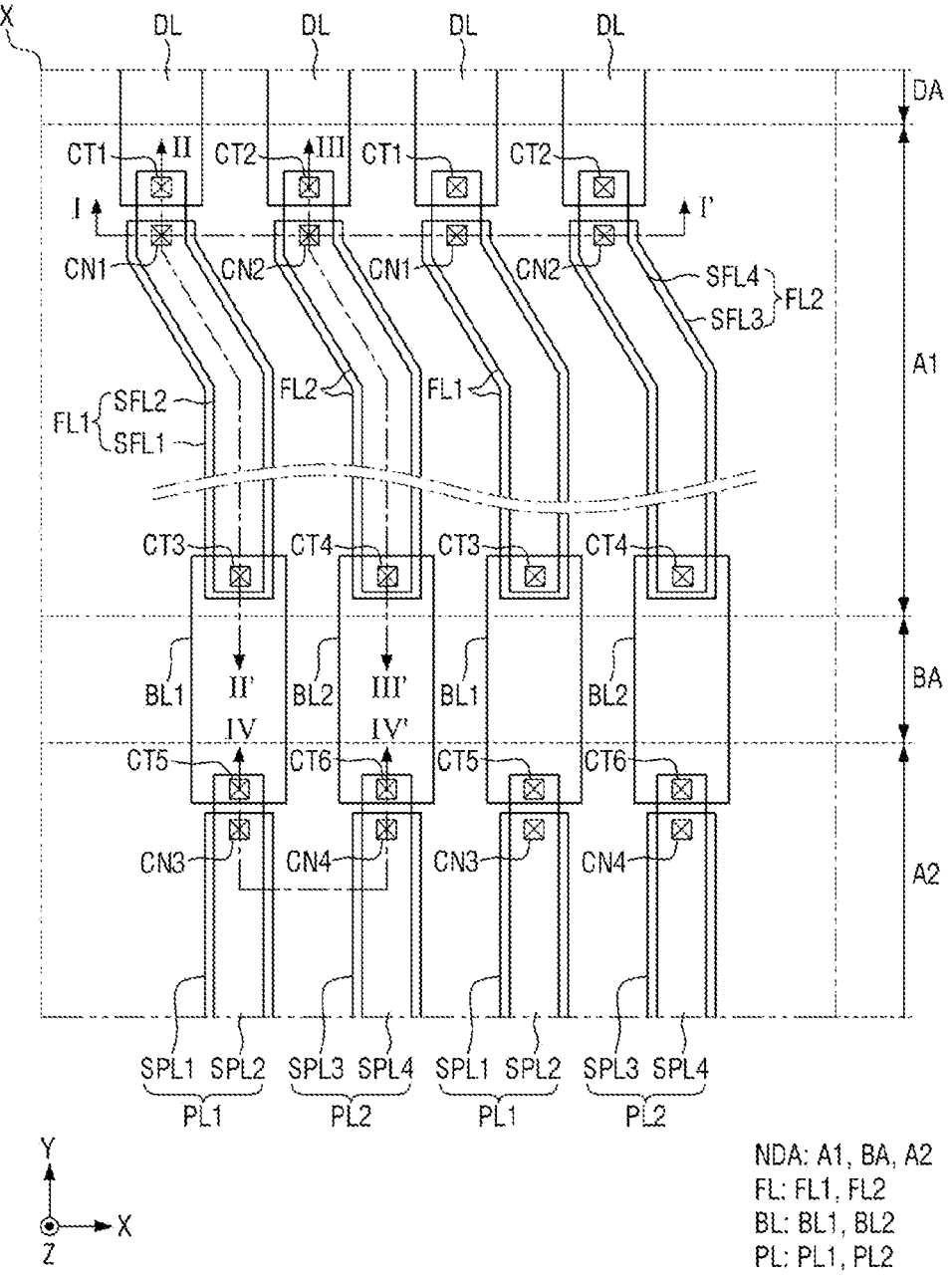
FIG. 8 is an enlarged plan view of region X of FIG. 4 according to an embodiment.

FIG. 8 is an enlarged plan view of region X of FIG. 4 according to an embodiment.

Referring to FIG. 8, the display device 10 may include the data lines DL disposed in the display area DA, the fan-out lines FL disposed in the line area A1, the bending lines BL disposed in the bending area BA, and the pad lines PL disposed in the pad area A2.

The data lines DL may input data signals to the plurality of sub-pixels SP disposed in the display area DA. The data lines DL may extend in the second direction (Y-axis direction).

The fan-out lines FL may be disposed between the data lines DL and the bending lines BL in the line area A1. The fan-out lines FL may include first fan-out lines FL1 and second fan-out lines FL2 each connected to the data lines DL. The first fan-out lines FL1 and the second fan-out lines FL2 may extend in the second direction (Y-axis direction), and may be alternately arranged along the first direction (X-axis direction).

The fan-out lines FL may be connected to the data lines DL through contact holes in the line area A1. For example, the first fan-out lines FL1 may be connected to the data lines DL through first contact holes CT1, and the second fan-out lines FL2 may be connected to the data lines DL through second contact holes CT2.

The first fan-out lines FL1 may include first sub-fan-out lines SFL1 and second sub-fan-out lines SFL2 which overlap each other in different conductive layers. The first sub-fan-out lines SFL1 and the second sub-fan-out lines SFL2 may overlap each other in a plan view and disposed in any two conductive layers of the first gate layer 130, the second gate layer 140, the third gate layer 150, and the fourth gate layer 170. A detailed description thereof will be described with reference to FIGS. 9 to 11.

The first sub-fan-out lines SFL1 and the second sub-fan-out lines SFL2 may be electrically connected to each other through contact holes in the line area A1. For example, the first sub-fan-out lines SFL1 and the second sub-fan-out lines SFL2 may be electrically connected to each other through first sub-contact holes CN1. When the first sub-fan-out lines SFL1 are disposed below the second sub-fan-out lines SFL2, fan-out lines connected to the data lines DL through the first contact holes CT1 may be the second sub-fan-out lines SFL2. In other words, the data lines DL may be connected to the second sub-fan-out lines SFL2 through the first contact holes CT1, and the second sub-fan-out lines SFL2 may be connected to the first sub-fan-out lines SFL1 through the first sub-contact holes CN1. Accordingly, the data lines DL, the first sub-fan-out lines SFL1, and the second sub-fan-out lines SFL2 may be electrically connected to each other, and may have the same signal applied thereto. This is only an example, and arrangement and connection relationships between these lines are not limited thereto.

The second fan-out lines FL2 may include third sub-fan-out lines SFL3 and fourth sub-fan-out lines SFL4 which overlap each other in different conductive layers. The third sub-fan-out lines SFL3 and the fourth sub-fan-out lines SFL4 may overlap each other in a plan view and disposed in the other two conductive layers in which the first fan-out lines FL1 are not disposed, of the first gate layer 130, the second gate layer 140, the third gate layer 150, and the fourth gate layer 170. A detailed description thereof will be described with reference to FIGS. 9 to 11.

The third sub-fan-out lines SFL3 and the fourth sub-fan-out lines SFL4 may be electrically connected to each other through contact holes in the line area A1. For example, the third sub-fan-out lines SFL3 and the fourth sub-fan-out lines SFL4 may be electrically connected to each other through second sub-contact holes CN2. When the third sub-fan-out lines SFL3 are disposed below the fourth sub-fan-out lines SFL4, fan-out lines connected to the data lines DL through the second contact holes CT2 may be the fourth sub-fan-out lines SFL4. In other words, the data lines DL may be connected to the fourth sub-fan-out lines SFL4 through the second contact holes CT2, and the fourth sub-fan-out lines SFL4 may be connected to the third sub-fan-out lines SFL3 through the second sub-contact holes CN2. Accordingly, the data lines DL, the third sub-fan-out lines SFL3, and the fourth sub-fan-out lines SFL4 may be electrically connected to each other, and may have the same signal applied thereto. This is only an example, and arrangement and connection relationships between these lines are not limited thereto.

In the display device 10 according to the present embodiment, in the line area A1, the first fan-out lines FL1 include the first sub-fan-out lines SFL1 and the second sub-fan-out lines SFL2 which overlap each other in different conductive layers and the second fan-out lines FL2 include the third sub-fan-out lines SFL3 and the fourth sub-fan-out lines SFL4 which overlap each other in different conductive layers, and thus, line resistance of the non-display area NDA may decrease.

TBALE 1

|  |  | Reference Model | Single Line | Double Line |
|---|---|---|---|---|
| FL | Rs (Ω) | 5173 | 3800 | 1900 |
|  | Cs (pF) | 12.7 | 17.0 | 19.0 |
|  | RC (μs) | 0.33 | 0.46 | 0.33 |

Referring to Table 1, in a case where the fan-out lines FL are formed as double lines, a thickness of the fan-out lines is doubled, and thus, resistance Rs of the fan-out lines may decrease to ½ as compared with a case where the fan-out lines FL are formed as single lines. For example, the resistance Rs of the fan-out line may decrease from 3800 ohms (Ω) to 1900Ω, that is, to ½. Accordingly, an RC value may decrease from 0.46 microseconds (μs) to 0.33 μs, which may correspond to an RC value of a reference model of a display device implementing high resolution. Accordingly, in the display device 10 according to the present embodiment, RC delay decreases and thus, a display device having high resolution may be implemented.

The numerical values in Table 1 were measured based on a case where 1H time in which a signal is applied to one data line DL during one frame was 2.8 μs. These numerical values are only an example, and may be different depending on a driving frequency of each pixel and the number of pixels. In addition, a capacitance value Cs of the fan-out line FL corresponds to a capacitance value of a capacitor formed between the respective lines with an insulating film interposed therebetween.

The bending lines BL may be lines bent in the bending area BA. The bending lines BL may be disposed between the fan-out lines FL and the pad lines PL. One ends of the bending lines BL may be connected to the fan-out lines FL through contact holes in the line area A1, and the other ends of the bending lines BL may be connected to the pad lines PL through contact holes in the pad area A2.

The bending lines BL may include first bending lines BL1 connected to the first fan-out lines FL1 and second bending lines BL2 connected to the second fan-out lines FL2. For example, the first bending lines BL1 may be connected to the second sub-fan-out lines SFL2 through third contact holes CT3, and the second bending lines BL2 may be connected to the fourth sub-fan-out lines SFL4 through fourth contact holes CT4. The first bending lines BL1 and the second bending lines BL2 may extend in the second direction (Y-axis direction), and may be alternately arranged along the first direction (X-axis direction).

The pad lines PL may be disposed in the pad area A2 and may be connected to the bending lines BL, respectively. The pad lines PL may be connected to the plurality of pads DP of the pad area A2, respectively. As another example, the pad lines PL may be connected to the display driving circuit 200 (see FIG. 1) of the pad area A2.

The pad lines PL may include first pad lines PL1 connected to the first bending lines BL1 and second pad lines PL2 connected to the second bending lines BL2. The first pad lines PL1 and the second pad lines PL2 may extend in the second direction (Y-axis direction), and may be alternately arranged along the first direction (X-axis direction).

The pad lines PL may be connected to the bending lines BL through contact holes in the pad area A2. For example, the first pad lines PL1 may be connected to the first bending lines BL1 through fifth contact holes CT5, and the second pad lines PL2 may be connected to the second bending lines BL2 through sixth contact holes CT6.

The first pad lines PL1 may include first sub-pad lines SPL1 and second sub-pad lines SPL2 which overlap each other in different conductive layers. The first sub-pad lines SPL1 and the second sub-pad lines SPL2 may overlap each other in a plan view and disposed in any two conductive layers of the first gate layer 130, the second gate layer 140, the third gate layer 150, and the fourth gate layer 170. A detailed description thereof will be described with reference to FIGS. 12 and 13.

The first sub-pad lines SPL1 and the second sub-pad lines SPL2 may be electrically connected to each other through contact holes in the pad area A2. For example, the first sub-pad lines SPL1 and the second sub-pad lines SPL2 may be electrically connected to each other through third sub-contact holes CN3. When the first sub-pad lines SPL1 are disposed below the second sub-pad lines SPL2, sub-pad lines connected to the first bending lines BL1 through the fifth contact holes CT5 may be the second sub-pad lines SPL2. In other words, the first bending lines BL1 may be connected to the second sub-pad lines SPL2 through the fifth contact holes CT5, and the second sub-pad lines SPL2 may be connected to the first sub-pad lines SPL1 through the third sub-contact holes CN3. Accordingly, the first bending lines BL1, the first sub-pad lines SPL1, and the second sub-pad lines SPL2 may be electrically connected to each other, and may have the same signal applied thereto. This is only an example, and arrangement and connection relationships between these lines are not limited thereto.

The second pad lines PL2 may include third sub-pad lines SPL3 and fourth sub-pad lines SPL4 which overlap each other in different conductive layers. The third sub-pad lines SPL3 and the fourth sub-pad lines SPL4 may overlap each other in a plan view and disposed in the other two conductive layers in which the first pad lines PL1 are not disposed, of the first gate layer 130, the second gate layer 140, the third gate layer 150, and the fourth gate layer 170. A detailed description thereof will be described with reference to FIGS. 12 and 13.

The third sub-pad lines SPL3 and the fourth sub-pad lines SPL4 may be electrically connected to each other through contact holes in the pad area A2. For example, the third sub-pad lines SPL3 and the fourth sub-pad lines SPL4 may be electrically connected to each other through fourth sub-contact holes CN4. When the third sub-pad lines SPL3 are disposed below the fourth sub-pad lines SPL4, sub-pad lines connected to the second bending lines BL2 through the sixth contact holes CT6 may be the fourth sub-pad lines SPL4. In other words, the second bending lines BL2 may be connected to the fourth sub-pad lines SPL4 through the sixth contact holes CT6, and the fourth sub-pad lines SPL4 may be connected to the third sub-pad lines SPL3 through the fourth sub-contact holes CN4. Accordingly, the second bending lines BL2, the third sub-pad lines SPL3, and the fourth sub-pad lines SPL4 may be electrically connected to each other, and may have the same signal applied thereto. This is only an example, and arrangement and connection relationships between these lines are not limited thereto.

In the display device 10 according to the present embodiment, in the pad area A2, the first pad lines PL1 include the first sub-pad lines SPL1 and the second sub-pad lines SPL2 which overlap each other in different conductive layers and the second pad lines PL2 include the third sub-pad lines SPL3 and the fourth sub-pad lines SPL4 which overlap each other in different conductive layers in a plan view, and thus, line resistance of the non-display area NDA may decrease.

An arrangement relationship between the first to fourth sub-fan-out lines SFL1 to SFL4 in the line area A1 according to an embodiment will be described with reference to FIGS. 9 to 11.

Figure 9:
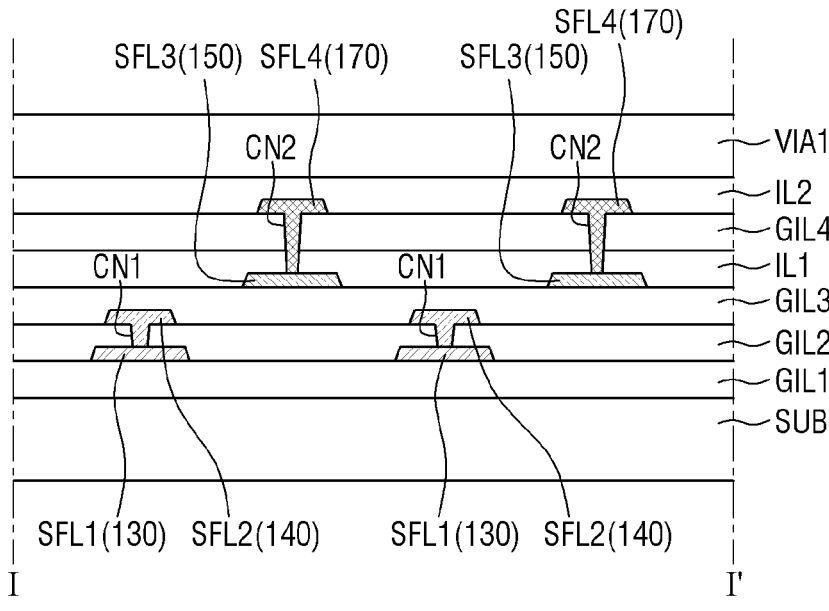
FIG. 9 is a cross-sectional view taken along line I-I' of FIG. 8 according to an embodiment.

FIG. 9 is a cross-sectional view taken along line I-I' of FIG. 8 according to an embodiment. FIG. 10 is a cross-sectional view taken along line II-II' of FIG. 8 according to an embodiment. FIG. 11 is a cross-sectional view taken along line III-III' of FIG. 8 according to an embodiment.

Figure 10:
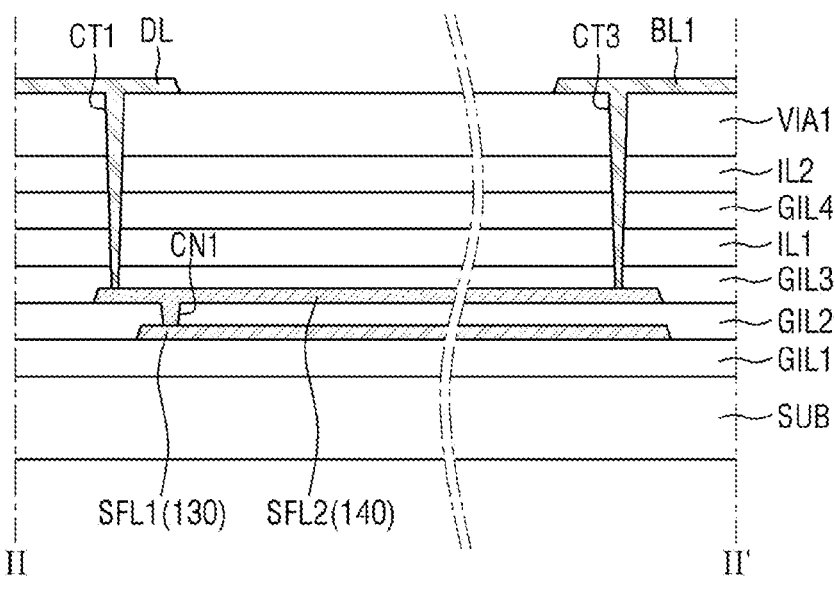
FIG. 10 is a cross-sectional view taken along line II-II' of FIG. 8 according to an embodiment.
Figure 11:
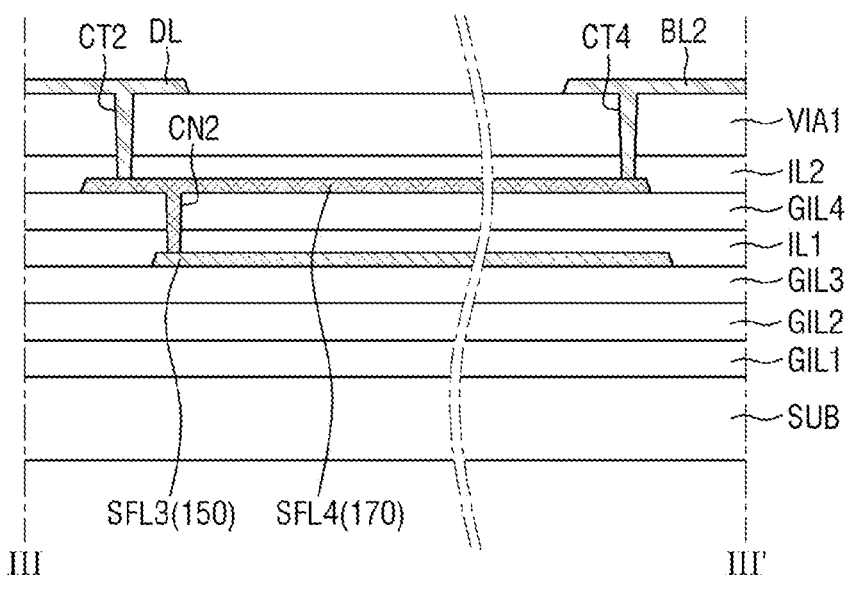
FIG. 11 is a cross-sectional view taken along line III-III' of FIG. 8 according to an embodiment.

Referring to FIGS. 9 to 11, the first sub-fan-out line SFL1 may be disposed in the first gate layer 130, and the second sub-fan-out line SFL2 may be disposed in the second gate layer 140. The third sub-fan-out line SFL3 may be disposed in the third gate layer 150, and the fourth sub-fan-out line SFL4 may be disposed in the fourth gate layer 170.

The first sub-contact hole CN1 may be a hole penetrating through the second gate insulating film GIL2 to expose the first sub-fan-out line SFL1. The second sub-fan-out line SFL2 may be connected to the first sub-fan-out line SFL1 through the first sub-contact hole CN1.

The second sub-contact hole CN2 may be a hole penetrating through the fourth gate insulating film GIL4 and the first interlayer insulating film IL1 to expose the third sub-fan-out line SFL3. The fourth sub-fan-out line SFL4 may be connected to the third sub-fan-out line SFL3 through the second sub-contact hole CN2.

Referring to FIG. 10, one end of the second sub-fan-out line SFL2 may be connected to the data line DL on the first planarization film VIA1 through the first contact hole CT1. The other end of the second sub-fan-out line SFL2 may be connected to the first bending line BL1 on the first planarization film VIA1 through the third contact hole CT3. Accordingly, the data line DL, the second sub-fan-out line SFL2, the first sub-fan-out line SFL1, and the first bending line BL1 may be electrically connected to each other. Since the first sub-fan-out line SFL1 and the second sub-fan-out line SFL2 overlap each other in a plan view and disposed in different conductive layers (the first gate layer 130 and the second gate layer 140), resistance of the first fan-out line FL1 may decrease.

Referring to FIG. 11, one end of the fourth sub-fan-out line SFL4 may be connected to the data line DL on the first planarization film VIA1 through the second contact hole CT2. The other end of the fourth sub-fan-out line SFL4 may be connected to the second bending line BL2 on the first planarization film VIA1 through the fourth contact hole CT4. Accordingly, the data line DL, the fourth sub-fan-out line SFL4, the third sub-fan-out line SFL3, and the second bending line BL2 may be electrically connected to each other. Since the third sub-fan-out line SFL3 and the fourth sub-fan-out line SFL4 overlap each other in a plan view and disposed in different conductive layers (the third gate layer 150 and the fourth gate layer 170), resistance of the second fan-out line FL2 may decrease.

In the display device 10 according to the present embodiment, the first fan-out lines FL1 overlap each other in a plan view and disposed in the first gate layer 130 and the second gate layer 140, and the second fan-out lines FL2 overlap each other in a plan view and disposed in the third gate layer 150 and the fourth gate layer 170, such that line resistance of the non-display area NDA may decrease to ½. When the line resistance decreases, an RC value decreases, and thus, resolution of the display device 10 may be effectively improved.

Hereinafter, an arrangement relationship between the first to fourth sub-pad lines SPL1 to SPL4 in the pad area A2 according to an embodiment will be described with reference to FIG. 12.

Figure 12:
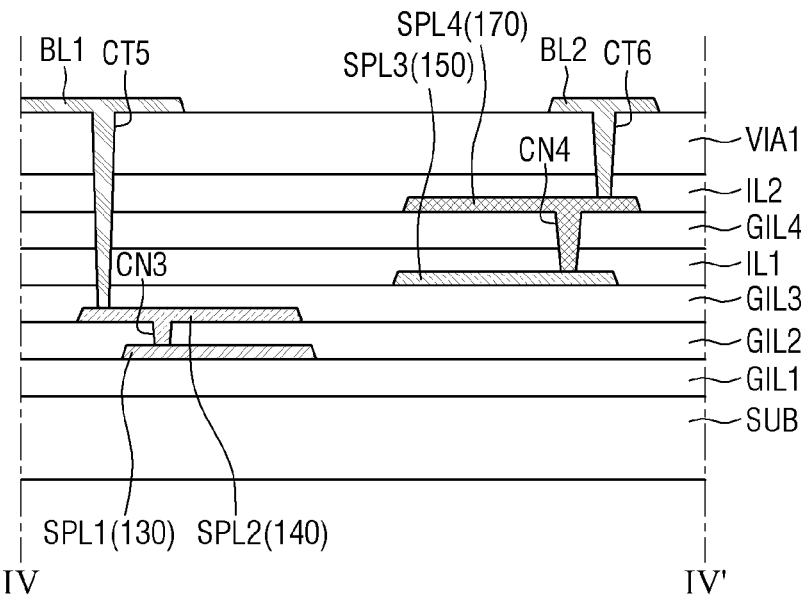
FIG. 12 is a cross-sectional view taken along line IV-IV' of FIG. 8 according to an embodiment.

FIG. 12 is a cross-sectional view taken along line IV-IV' of FIG. 8 according to an embodiment.

According to the present embodiment, the first pad line PL1 electrically connected to the first fan-out line FL1 may have substantially the same arrangement structure as that of the first fan-out line FL1, and the second pad line PL2 electrically connected to the second fan-out line FL2 may have substantially the same arrangement structure as that of the second fan-out line FL2.

That is, the first sub-pad line SPL1 may be disposed in the first gate layer 130 that is the same as the layer on which the first sub-fan-out line SFL1 is disposed, the second sub-pad line SPL2 may be disposed in the second gate layer 140 that is the same as the layer on which the second sub-fan-out line SFL2 is disposed, and the first sub-pad line SPL1 and the second sub-pad line SPL2 may overlap each other in a plan view and disposed in the first gate layer 130 and the second gate layer 140. That is, the third sub-pad line SPL3 may be disposed in the third gate layer 150 that is the same as the layer on which the third sub-fan-out line SFL3 is disposed, the fourth sub-pad line SPL4 may be disposed in the fourth gate layer 170 that is the same as the layer on which the fourth sub-fan-out line SFL4 is disposed, and the third sub-pad line SPL3 and the fourth sub-pad line SPL4 may overlap each other in a plan view and disposed in the third gate layer 150 and the fourth gate layer 170.

The third sub-contact hole CN3 may be a hole penetrating through the second gate insulating film GIL2 to expose the first sub-pad line SPL1. The second sub-pad line SPL2 may be connected to the first sub-pad line SPL1 through the third sub-contact hole CN3. The first bending line BL1 may be connected to the second sub-pad line SPL2 through the fifth contact hole CT5. Accordingly, the first bending line BL1, the second sub-pad line SPL2, and the first sub-pad line SPL1 may be electrically connected to each other.

The fourth sub-contact hole CN4 may be a hole penetrating through the fourth gate insulating film GIL4 and the first interlayer insulating film IL1 to expose the third sub-pad line SPL3. The fourth sub-pad line SPL4 may be connected to the third sub-pad line SPL3 through the fourth sub-contact hole CN4. The second bending line BL2 may be connected to the fourth sub-pad line SPL4 through the sixth contact hole CT6. Accordingly, the second bending line BL2, the fourth sub-pad line SPL4, and the third sub-pad line SPL3 may be electrically connected to each other.

In the display device 10 according to the present embodiment, the first pad lines PL1 overlap each other in a plan view and disposed in the first gate layer 130 and the second gate layer 140, and the second pad lines PL2 overlap each other in a plan view and disposed in the third gate layer 150 and the fourth gate layer 170, such that line resistance of the non-display area NDA may decrease to ½. When the line resistance decreases, an RC value decreases, and thus, resolution of the display device 10 may be improved.

An arrangement relationship between the first to fourth sub-pad lines SPL1 to SPL4 according to another embodiment will be described with reference to FIGS. 8 and 13.

Figure 13:
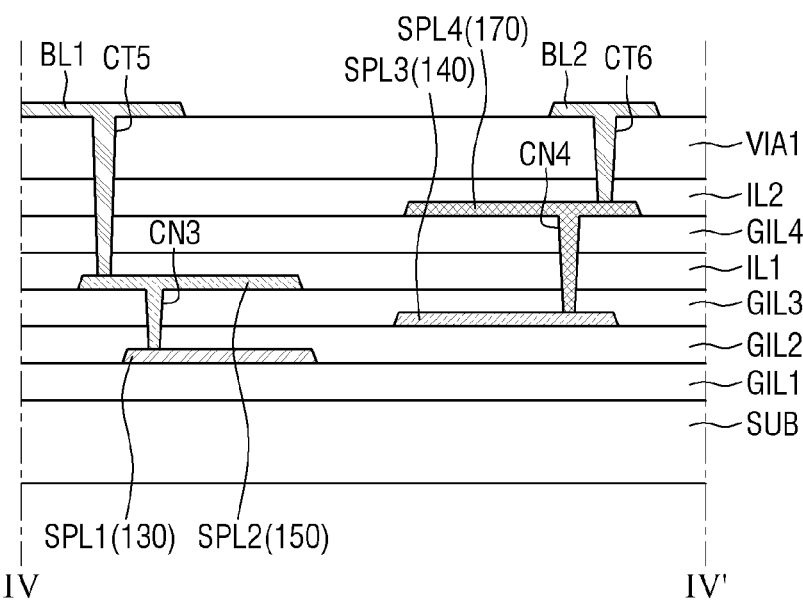
FIG. 13 is a cross-sectional view taken along line IV-IV' of FIG. 8 according to another embodiment.

FIG. 13 is a cross-sectional view taken along line IV-IV' of FIG. 8 according to another embodiment.

The present embodiment is different from an embodiment of FIG. 12 in that the first sub-pad line SPL1 and the second sub-pad line SPL2 of the first pad line PL1 to which the same signal as a signal applied to the first fan-out line FL1 is applied are disposed in conductive layers different from the conductive layers in which the first fan-out line FL1 is disposed. In addition, the present embodiment is different from an embodiment of FIG. 12 in that the third sub-pad line SPL3 and the fourth sub-pad line SPL4 of the second pad line PL2 to which the same signal as a signal applied to the second fan-out line FL2 is applied are disposed in conductive layers different from the conductive layers in which the second fan-out line FL2 is disposed.

For example, the first sub-pad line SPL1 may be disposed on the first gate layer 130 that is the same as the layer on which the first sub-fan-out line SFL1 is disposed, the second sub-pad line SPL2 may be disposed on the third gate layer 150 that is the same as the layer on which the third sub-fan-out line SFL3 is disposed, the third sub-pad line SPL3 may be disposed on the second gate layer 140 that is the same as the layer on which the second sub-fan-out line SFL2 is disposed, and the fourth sub-pad line SPL4 may be disposed on the fourth gate layer 170 that is the same as the layer on which the fourth sub-fan-out line SFL4 is disposed.

An arrangement relationship between the first fan-out line FL1 and the first pad line PL1 and an arrangement relationship between the second fan-out line FL2 and the second pad line PL2 are not limited to those of FIGS. 12 and 13. For example, the first sub-pad line SPL1 may be disposed in the third gate layer 150, and the second sub-pad line SPL2 may be disposed in the fourth gate layer 170.

Hereinafter, an arrangement relationship between first to fourth sub-fan-out lines SFL1 to SFL4 disposed in a line area A1 of a display device 10 according to another embodiment will be described with reference to FIGS. 14 to 16.

Figure 14:
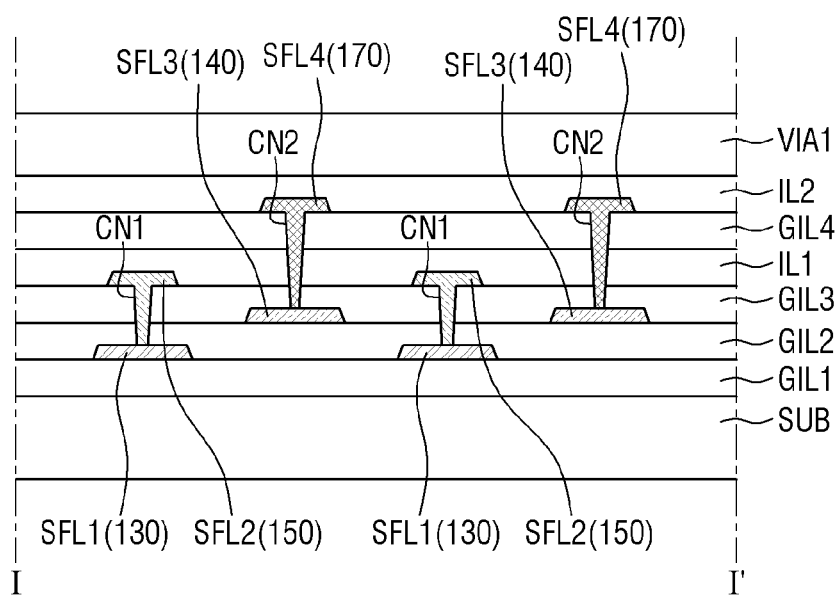
FIG. 14 is a cross-sectional view taken along line I-I' of FIG. 8 according to another embodiment.

FIG. 14 is a cross-sectional view taken along line I-I' of FIG. 8 according to another embodiment. FIG. 15 is a cross-sectional view taken along line II-II' of FIG. 8 according to another embodiment. FIG. 16 is a cross-sectional view taken along line III-III' of FIG. 8 according to another embodiment.

Figure 15:
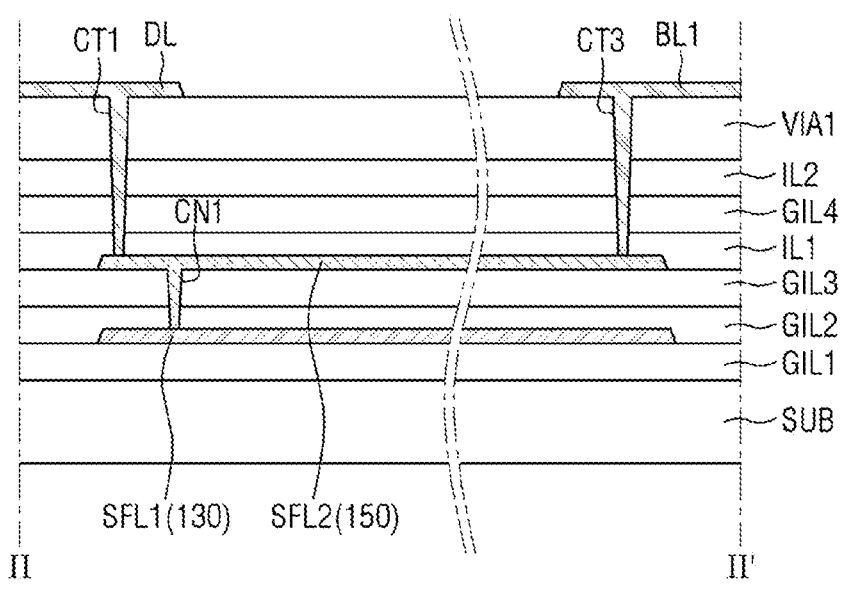
FIG. 15 is a cross-sectional view taken along line II-II' of FIG. 8 according to another embodiment.
Figure 16:
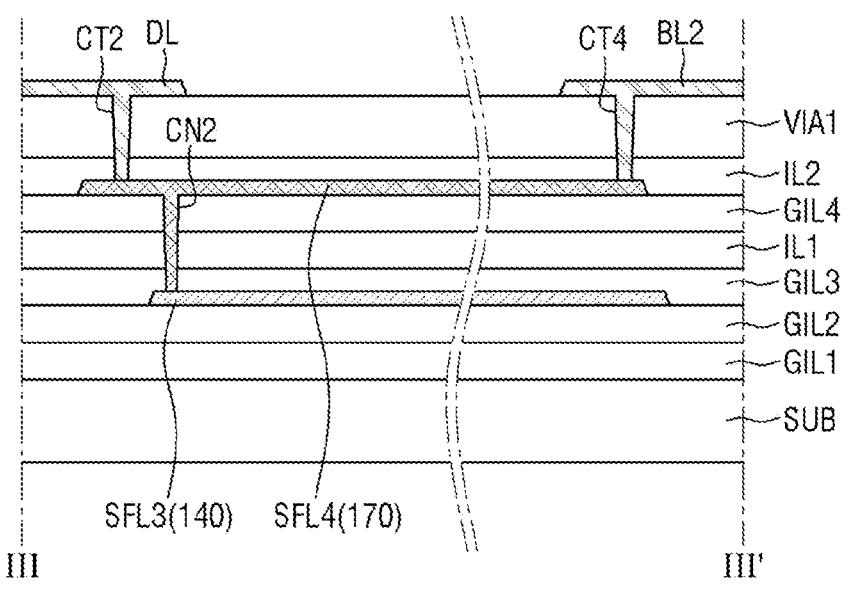
FIG. 16 is a cross-sectional view taken along line III-III' of FIG. 8 according to another embodiment.

Referring to FIGS. 14 to 16, the first sub-fan-out line SFL1 may be disposed in the first gate layer 130, and the second sub-fan-out line SFL2 may be disposed in the third gate layer 150. The third sub-fan-out line SFL3 may be disposed in the second gate layer 140, and the fourth sub-fan-out line SFL4 may be disposed in the fourth gate layer 170.

The first sub-contact hole CN1 may be a hole penetrating through the second gate insulating film GIL2 and the third gate insulating film GIL3 to expose the first sub-fan-out line SFL1. The second sub-fan-out line SFL2 may be connected to the first sub-fan-out line SFL1 through the first sub-contact hole CN1.

The second sub-contact hole CN2 may be a hole penetrating through the third gate insulating film GIL3, the first interlayer insulating film IL1, and the fourth gate insulating film GIL4 to expose the third sub-fan-out line SFL3. The fourth sub-fan-out line SFL4 may be connected to the third sub-fan-out line SFL3 through the second sub-contact hole CN2.

Referring to FIG. 15, one end of the second sub-fan-out line SFL2 may be connected to the data line DL on the first planarization film VIA1 through the first contact hole CT1. The other end of the second sub-fan-out line SFL2 may be connected to the first bending line BL1 on the first planarization film VIA1 through the third contact hole CT3. Accordingly, the data line DL, the second sub-fan-out line SFL2, the first sub-fan-out line SFL1, and the first bending line BL1 may be electrically connected to each other. Since the first sub-fan-out line SFL1 and the second sub-fan-out line SFL2 overlap each other in a plan view and disposed in different conductive layers (the first gate layer 130 and the third gate layer 150), resistance of the first fan-out line FL1 may effectively decrease.

Referring to FIG. 16, one end of the fourth sub-fan-out line SFL4 may be connected to the data line DL on the first planarization film VIA1 through the second contact hole CT2. The other end of the fourth sub-fan-out line SFL4 may be connected to the second bending line BL2 on the first planarization film VIA1 through the fourth contact hole CT4. Accordingly, the data line DL, the fourth sub-fan-out line SFL4, the third sub-fan-out line SFL3, and the second bending line BL2 may be electrically connected to each other. Since the third sub-fan-out line SFL3 and the fourth sub-fan-out line SFL4 overlap each other in a plan view and disposed in different conductive layers (the second gate layer 140 and the fourth gate layer 170), resistance of the second fan-out line FL2 may decrease.

In the display device 10 according to the present embodiment, the first fan-out lines FL1 overlap each other in a plan view and disposed in the first gate layer 130 and the third gate layer 150, and the second fan-out lines FL2 overlap each other in a plan view and disposed in the second gate layer 140 and the fourth gate layer 170, such that line resistance of the non-display area NDA may decrease to ½.

When the line resistance decreases, an RC value decreases, and thus, resolution of the display device 10 may be improved.

Hereinafter, an arrangement relationship between first to fourth sub-fan-out lines SFL1 to SFL4 disposed in a line area A1 of a display device 10 according to still another embodiment will be described with reference to FIGS. 17 to 19.

Figure 17:
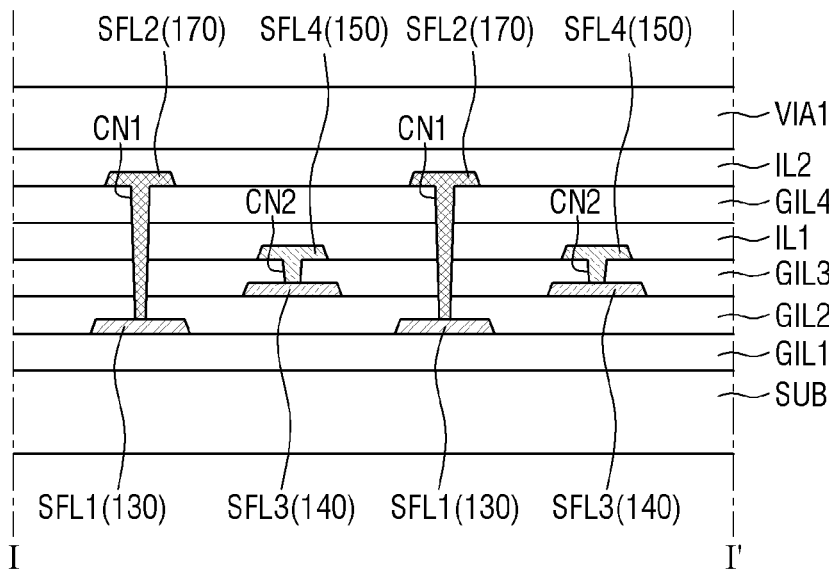
FIG. 17 is a cross-sectional view taken along line I-I' of FIG. 8 according to still another embodiment.

FIG. 17 is a cross-sectional view taken along line I-I' of FIG. 8 according to still another embodiment. FIG. 18 is a cross-sectional view taken along line II-II' of FIG. 8 according to still another embodiment. FIG. 19 is a cross-sectional view taken along line III-III' of FIG. 8 according to still another embodiment.

Figure 18:
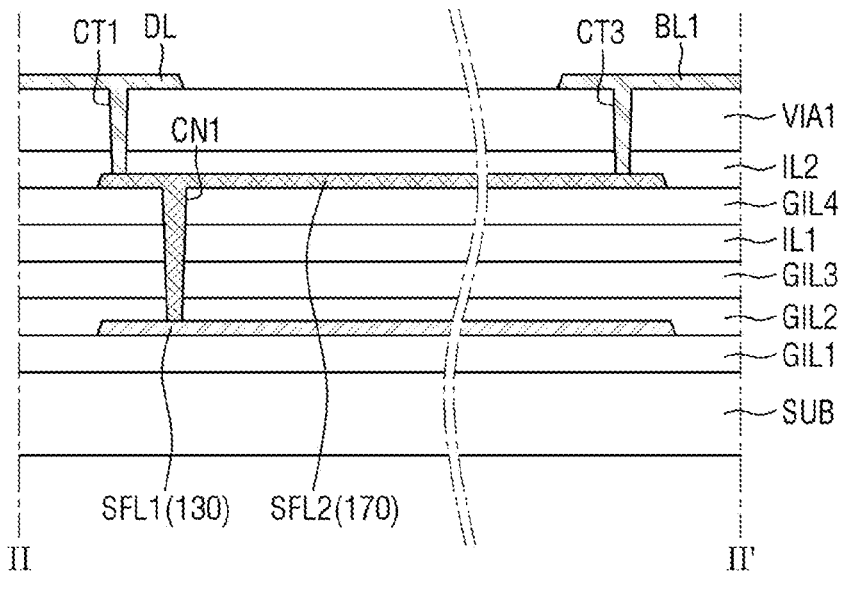
FIG. 18 is a cross-sectional view taken along line II-II' of FIG. 8 according to still another embodiment.
Figure 19:
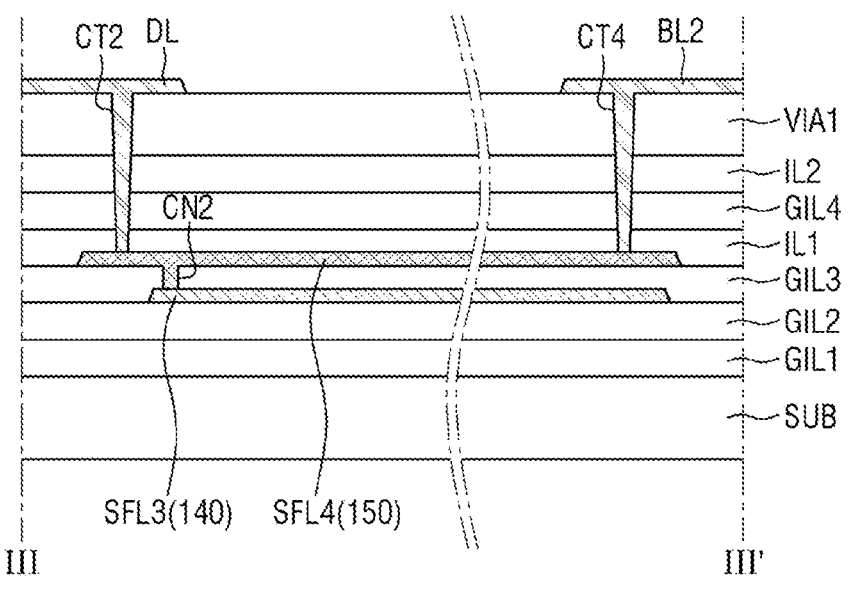
FIG. 19 is a cross-sectional view taken along line III-III' of FIG. 8 according to still another embodiment.

Referring to FIGS. 17 to 19, the first sub-fan-out line SFL1 may be disposed in the first gate layer 130, and the second sub-fan-out line SFL2 may be disposed in the fourth gate layer 170. The third sub-fan-out line SFL3 may be disposed in the second gate layer 140, and the fourth sub-fan-out line SFL4 may be disposed in the third gate layer 150.

The first sub-contact hole CN1 may be a hole penetrating through the second gate insulating film GIL2, the third gate insulating film GIL3, the first interlayer insulating film IL1, and the fourth gate insulating film GIL4 to expose the first sub-fan-out line SFL1. The second sub-fan-out line SFL2 may be connected to the first sub-fan-out line SFL1 through the first sub-contact hole CN1.

The second sub-contact hole CN2 may be a hole penetrating through the third gate insulating film GIL3 to expose the third sub-fan-out line SFL3. The fourth sub-fan-out line SFL4 may be connected to the third sub-fan-out line SFL3 through the second sub-contact hole CN2.

Referring to FIG. 18, one end of the second sub-fan-out line SFL2 may be connected to the data line DL on the first planarization film VIA1 through the first contact hole CT1. The other end of the second sub-fan-out line SFL2 may be connected to the first bending line BL1 on the first planarization film VIA1 through the third contact hole CT3. Accordingly, the data line DL, the second sub-fan-out line SFL2, the first sub-fan-out line SFL1, and the first bending line BL1 may be electrically connected to each other. Since the first sub-fan-out line SFL1 and the second sub-fan-out line SFL2 overlap each other in a plan view and disposed in different conductive layers (the first gate layer 130 and the fourth gate layer 170), resistance of the first fan-out line FL1 may decrease.

Referring to FIG. 19, one end of the fourth sub-fan-out line SFL4 may be connected to the data line DL on the first planarization film VIA1 through the second contact hole CT2. The other end of the fourth sub-fan-out line SFL4 may be connected to the second bending line BL2 on the first planarization film VIA1 through the fourth contact hole CT4. Accordingly, the data line DL, the fourth sub-fan-out line SFL4, the third sub-fan-out line SFL3, and the second bending line BL2 may be electrically connected to each other. Since the third sub-fan-out line SFL3 and the fourth sub-fan-out line SFL4 overlap each other in a plan view and disposed in different conductive layers (the second gate layer 140 and the third gate layer 150), resistance of the second fan-out line FL2 may decrease.

In the display device 10 according to the present embodiment, the first fan-out lines FL1 overlap each other in a plan view and disposed in the first gate layer 130 and the fourth gate layer 170, and the second fan-out lines FL2 overlap each other in a plan view and disposed in the second gate layer 140 and the third gate layer 150, such that line resistance of the non-display area NDA may decrease to ½. When the line resistance decreases, an RC value decreases, and thus, resolution of the display device 10 may be improved.

Hereinafter, an arrangement relationship between fan-out lines FL of a display device 10 according to still another embodiment will be described with reference to FIGS. 20 and 21.

Figure 20:
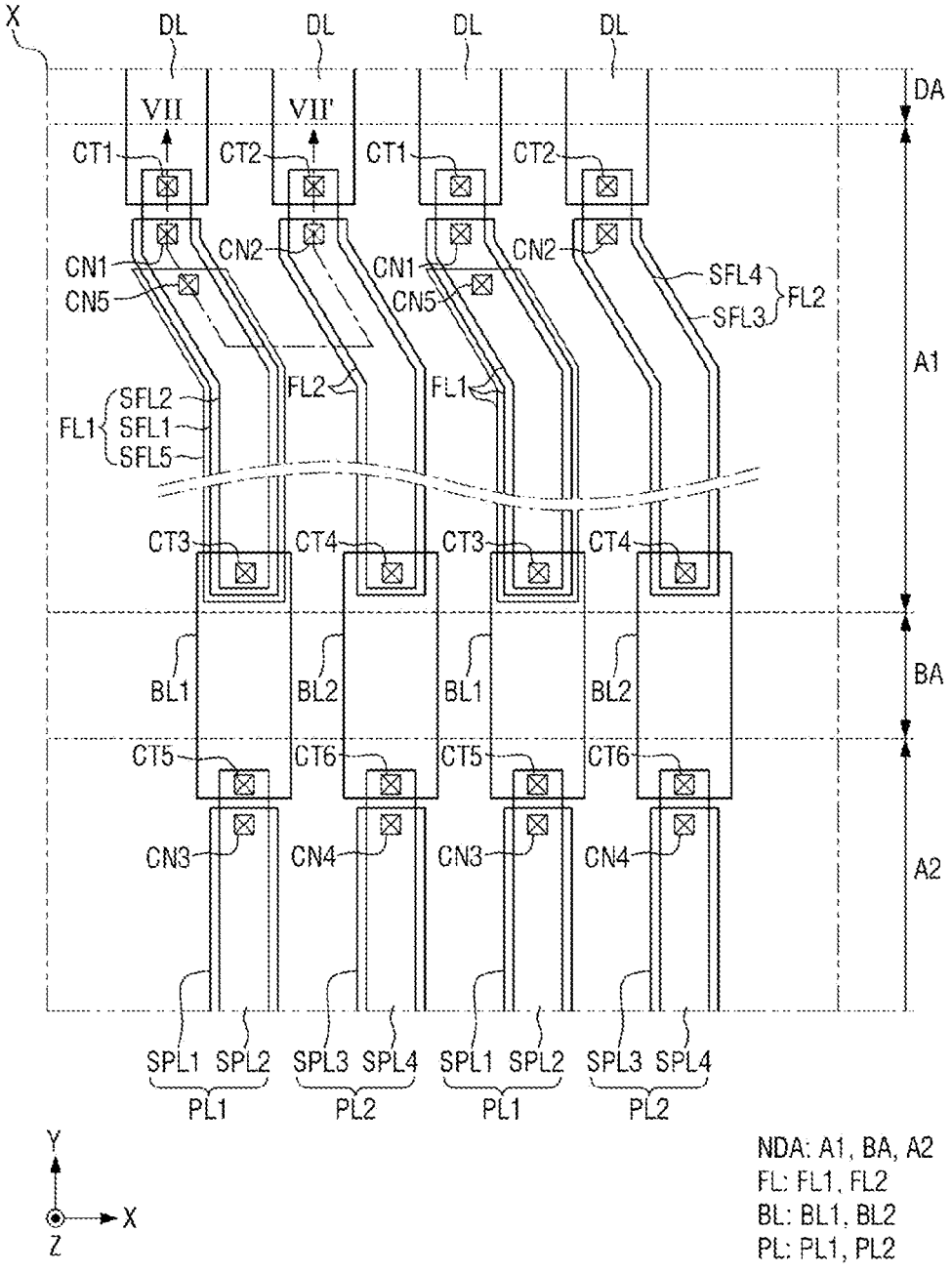
FIG. 20 is an enlarged plan view of region X of FIG. 4 according to still another embodiment.

FIG. 20 is an enlarged plan view of region X of FIG. 4 according to still another embodiment. FIG. 21 is a cross-sectional view taken along line VII-VII' of FIG. 20.

Figure 21:
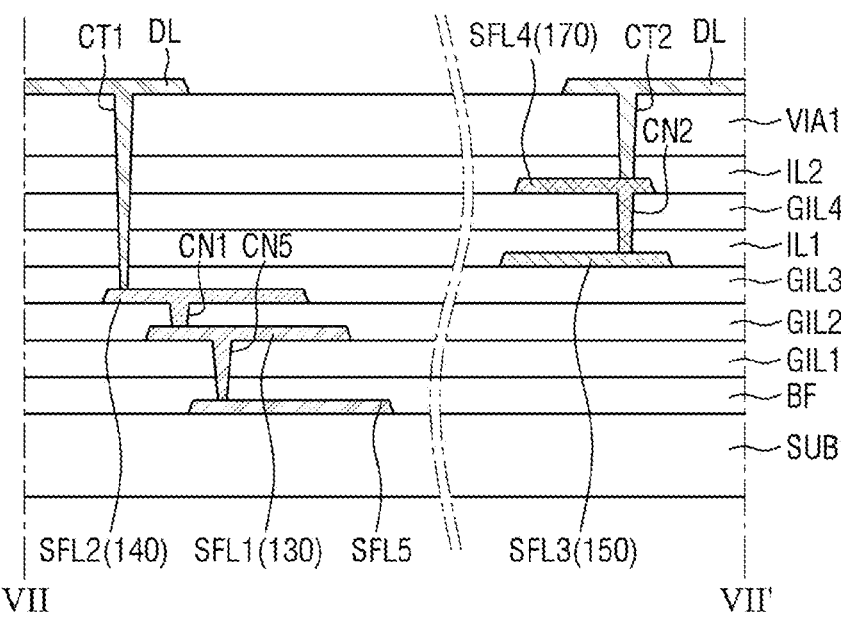
FIG. 21 is a cross-sectional view taken along line VII-VII' of FIG. 20.

Referring to FIGS. 20 and 21, a display device 10 according to the present embodiment is different from the display device according to an embodiment of FIGS. 5 to 11 in that the first fan-out line FL1 further includes a fifth sub-fan-out line SFL5 overlapping the first sub-fan-out line SFL1 and the second sub-fan-out line SFL2.

The fifth sub-fan-out line SFL5 may be disposed on the substrate SUB, and may be disposed between the substrate SUB and the first gate insulating film GIL1. The buffer layer BF may be disposed on the fifth sub-fan-out line SFL5 and cover the fifth sub-fan-out line SFL5. The fifth sub-fan-out line SFL5 may be disposed in the same layer as the first light blocking layer BML1 (see FIG. 6).

The fifth sub-fan-out line SFL5 may be connected to the first sub-fan-out line SFL1 through a fifth sub-contact hole CN5 penetrating through the first gate insulating film GIL1 and the buffer layer BF. Since the fifth sub-fan-out line SFL5 is connected to the first sub-fan-out line SFL1, the fifth sub-fan-out line SFL5 may be electrically connected to the data line DL, the second sub-fan-out line SFL2, and the first sub-fan-out line SFL1, and may receive the same signal as the signal applied to the data line DL, the second sub-fan-out line SFL2, and the first sub-fan-out line SFL1.

The display device 10 according to the present embodiment further includes the fifth sub-fan-out line SFL5 overlapping the first sub-fan-out line SFL1 and the second sub-fan-out line SFL2, and thus, a thickness of the fan-out line disposed in the non-display area NDA may further increase. Accordingly, line resistance may be decreased, and RC delay may be decreased.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
a substrate including a display area including a plurality of pixels for displaying an image and a non-display area disposed around the display area;
data lines disposed in the display area and which receives data signals;
first fan-out lines and second fan-out lines in the non-display area and connected to the data lines; and
fifth sub-fan-out lines disposed under the first fan-out lines in the non-display area,
wherein each of the first fan-out lines includes a first sub-fan-out line and a second sub-fan-out line which overlap each other in a plan view,
each of the second fan-out lines includes a third sub-fan-out line and a fourth sub-fan-out line which overlap each other in the plan view, the first sub-fan-out line, the second sub-fan-out line, the third sub-fan-out line, and the fourth sub-fan-out line are disposed in different conductive layers from each other, and each of the fifth sub-fan-out lines overlaps a corresponding first sub-fan-out line and a corresponding second sub-fan-out line in the plan view.

2. The display device of claim 1, wherein the first sub-fan-out line and the second sub-fan-out line are electrically connected to each other through a first contact hole, and the third sub-fan-out line and the fourth sub-fan-out line are electrically connected to each other through a second contact hole.

3. The display device of claim 1, wherein the first fan-out lines and the second fan-out lines are alternately arranged in one direction.

4. The display device of claim 1, wherein each of the plurality of pixels includes:

a first transistor including a first semiconductor layer disposed on the substrate and a first gate electrode disposed on the first semiconductor layer;

a capacitor including a first capacitor electrode disposed on the first gate electrode and a second capacitor electrode disposed on the first capacitor electrode; and a second transistor including a second semiconductor layer disposed on the second capacitor electrode and a second gate electrode disposed on the second semiconductor layer, wherein the second semiconductor layer includes a material different from a material of the first semiconductor layer.

5. The display device of claim 4, wherein the first semiconductor layer includes polysilicon, and the second semiconductor layer includes an oxide semiconductor.

6. The display device of claim 4, wherein the first sub-fan-out line is disposed in a same layer as a layer in which the first gate electrode is disposed, the second sub-fan-out line is disposed in a same layer as a layer in which the first capacitor electrode is disposed, the third sub-fan-out line is disposed in a same layer as a layer in which the second capacitor electrode is disposed, and the fourth sub-fan-out line is disposed in a same layer as a layer in which the second gate electrode is disposed.

7. The display device of claim 4, wherein the first sub-fan-out line is disposed in a same layer as a layer in which the first gate electrode is disposed, the second sub-fan-out line is disposed in a same layer as a layer in which the second capacitor electrode is disposed, and the third sub-fan-out line is disposed in a same layer as a layer in which the first capacitor electrode is disposed, and the fourth sub-fan-out line is disposed in a same layer as a layer in which the second gate electrode is disposed.

8. The display device of claim 4, wherein the first sub-fan-out line is disposed in a same layer as a layer in which the first gate electrode is disposed, the second sub-fan-out line is disposed in a same layer as a layer in which the second gate electrode is disposed, and the third sub-fan-out line is disposed in a same layer as a layer in which the first capacitor electrode is disposed, and the fourth sub-fan-out line is disposed in a same layer as a layer in which the second capacitor electrode is disposed.

9. A display device comprising:

a substrate;

a first insulating film disposed on the substrate;

a first gate electrode and a first sub-fan-out line disposed on the first insulating film;

a second insulating film disposed on the first gate electrode and the first sub-fan-out line;

a first capacitor electrode and a second sub-fan-out line disposed on the second insulating film;

a third insulating film disposed on the first capacitor electrode and the second sub-fan-out line;

a second capacitor electrode and a third sub-fan-out line disposed on the third insulating film;

a fourth insulating film disposed on the second capacitor electrode and the third sub-fan-out line;

a second gate electrode and a fourth sub-fan-out line disposed on the fourth insulating film; and a fifth sub-fan-out line disposed between the substrate and the first insulating film, wherein two of the first sub-fan-out line, the second sub-fan-out line, the third sub-fan-out line, and the fourth sub-fan-out line overlap each other, and the other two of the first sub-fan-out line, the second sub-fan-out line, the third sub-fan-out line, and the fourth sub-fan-out line overlap each other in a plan view, wherein the fifth sub-fan-out line overlaps two of the first sub-fan-out line, the second sub-fan-out line, the third sub-fan-out line, and the fourth sub-fan-out line in the plan view.

10. The display device of claim 9, wherein the second sub-fan-out line is connected to the first sub-fan-out line through a first contact hole penetrating through the second insulating film, and the fourth sub-fan-out line is connected to the third sub-fan-out line through a second contact hole penetrating through the fourth insulating film.

11. The display device of claim 9, wherein the third sub-fan-out line is connected to the first sub-fan-out line through a third contact hole penetrating through the second insulating film and the third insulating film, and the fourth sub-fan-out line is connected to the second sub-fan-out line through a fourth contact hole penetrating through the third insulating film and the fourth insulating film.

12. The display device of claim 9, wherein the third sub-fan-out line is connected to the second sub-fan-out line through a fifth contact hole penetrating through the third insulating film, and the fourth sub-fan-out line is connected to the first sub-fan-out line through a sixth contact hole penetrating through the second insulating film, the third insulating film, and the fourth insulating film.

13. The display device of claim 9, wherein the first sub-fan-out line is connected to the fifth sub-fan-out line through a seventh contact hole penetrating through the first insulating film.

14. The display device of claim 9, wherein the first gate electrode, the first capacitor electrode, and the second capacitor electrode overlap each other in the plan view.

15. A display device comprising:

a display area including a plurality of pixels;

a line area disposed on one side of the display area;

a pad area including a plurality of pads;

a bending area disposed between the line area and the pad area;

a first fan-out line and a second fan-out line disposed in the line area;

a first bending line disposed in the bending area and connected to the first fan-out line, and a second bending line disposed in the bending area and connected to the second fan-out line; and a first pad line disposed in the pad area and connected to the first bending line, and a second pad line disposed in the pad area and connected to the second bending line, wherein the first pad line and the second pad line are connected to the plurality of pads, the first pad line includes a first sub-pad line and a second sub-pad line which overlap each other in a plan view, the second pad line includes a third sub-pad line and a fourth sub-pad line which overlap each other in the plan view, the first sub-pad line, the second sub-pad line, the third sub-pad line, and the fourth sub-pad line are disposed in different conductive layers from each other.

16. The display device of claim 15, wherein the first fan-out line includes a first sub-fan-out line and a second sub-fan-out line which overlap each other in the plan view, the second fan-out line includes a third sub-fan-out line and a fourth sub-fan-out line which overlap each other in the plan view, and the first sub-fan-out line, the second sub-fan-out line, the third sub-fan-out line, and the fourth sub-fan-out line are disposed in different conductive layers from each other.

17. The display device of claim 16, wherein the first sub-fan-out line and the first sub-pad line are disposed in a same layer, and the second sub-fan-out line and the second sub-pad line are disposed in a same layer.

18. The display device of claim 16, wherein the second sub-fan-out line and the third sub-pad line are disposed in a same layer, and the third sub-fan-out line and the second sub-pad line are disposed in a same layer.

19. The display device of claim 16, wherein the first fan-out line, the first bending line, and the first pad line have a same signal applied thereto, and the second fan-out line, the second bending line, and the second pad line have a same signal applied thereto.

* * * * *